US012015439B2

(12) United States Patent
Spence

(10) Patent No.: US 12,015,439 B2
(45) Date of Patent: *Jun. 18, 2024

(54) METHODS AND SYSTEMS FOR COMMUNICATING DATA AND CONTROL INFORMATION OVER A SERIAL LINK

(71) Applicant: NXP USA, Inc., Austin, TX (US)

(72) Inventor: Nicholas Justin Mountford Spence, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 292 days.

This patent is subject to a terminal disclaimer.

(21) Appl. No.: 17/352,207

(22) Filed: Jun. 18, 2021

(65) Prior Publication Data

US 2022/0407558 A1 Dec. 22, 2022

(51) Int. Cl.
*H04B 1/48* (2006.01)
*G06F 13/38* (2006.01)
*G06F 13/42* (2006.01)
*H03M 1/66* (2006.01)

(52) U.S. Cl.
CPC ............. *H04B 1/48* (2013.01); *G06F 13/385* (2013.01); *G06F 13/4282* (2013.01); *H03M 1/662* (2013.01)

(58) Field of Classification Search
CPC .. G06F 13/385; G06F 13/4282; H03M 1/662; H04B 1/48

See application file for complete search history.

(56) References Cited

U.S. PATENT DOCUMENTS

| 8,964,791 | B2 | 2/2015 | Vu et al. |
| 9,136,804 | B2 | 9/2015 | Staudinger et al. |
| 9,219,540 | B2 | 12/2015 | Vu et al. |
| 9,225,291 | B2 | 12/2015 | Ahmed et al. |

(Continued)

FOREIGN PATENT DOCUMENTS

EP 3993277 A1 5/2022

OTHER PUBLICATIONS

RF front end definition by Wikipedia; see office appendix (Year: 2022).*

(Continued)

*Primary Examiner* — Patrick C Chen
(74) *Attorney, Agent, or Firm* — Sherry W. Gourlay; Bruce M. Green

(57) ABSTRACT

A communication system includes a digital data processor that produces a digital data sample and one or more control bits. A serialized transmit interface assembles the digital data sample and the control bit(s) into first and second data packets of a data frame, and sends the data frame over a signal line. A serialized receive interface receives the data frame and produces a reconstructed digital data sample and the control bit(s) from the first and second data packets. A control circuit coupled to the serialized receive interface produces a control signal from the control bit(s). The communication system may include a converter circuit, which produces an RF input signal by performing a digital-to-analog conversion of the reconstructed digital data sample, and by upconverting the resulting analog data sample signal to RF. A power amplifier amplifies the RF input signal and modifies operation of a sub-circuit based on the control signal.

19 Claims, 10 Drawing Sheets

(56) References Cited

U.S. PATENT DOCUMENTS

| | | | |
|---|---|---|---|
| 11,172,456 B1* | 11/2021 | Spence | H04B 1/40 |
| 2009/0284401 A1 | 11/2009 | Nanevicz | |
| 2010/0199158 A1* | 8/2010 | Friedman | H04L 12/2838 |
| | | | 375/220 |
| 2014/0023048 A1 | 1/2014 | Vu et al. | |
| 2014/0105101 A1 | 4/2014 | Vu et al. | |
| 2015/0028948 A1* | 1/2015 | Staudinger | H03F 1/0288 |
| | | | 330/251 |
| 2017/0201218 A1* | 7/2017 | Wang | H03F 1/565 |
| 2017/0317738 A1 | 11/2017 | Lange | |

OTHER PUBLICATIONS

Analog Devices; "Data Sheet—AD6674—385 MHz BW IF Diversity Receiver"; 97 pages (Nov. 1, 2016).

Analog Devices; "Data Sheet—AD9144—Quad, 16-Bit, 2.8 GSPS, TxDAC+ Digital-to-Analog Converter"; 126 pages (Nov. 1, 2016).

JEDEC Solid State Technology Association; "JEDEC Standard—Serial Interface for Data Converters—JESD204C"; 294 pages (Dec. 2017).

Notice of Allowance; U.S. Appl. No. 17/088,111; 8 pages (dated Apr. 5, 2021).

U.S. Appl. No. 17/088,111 45 pages (filed Nov. 3, 2020).

* cited by examiner

METHODS AND SYSTEMS FOR COMMUNICATING DATA AND CONTROL INFORMATION OVER A SERIAL LINK

TECHNICAL FIELD

Embodiments of the subject matter described herein relate generally to radio frequency (RF) communication systems, and more particularly to RF transmitters that utilize a serial link between a digital signal processor and a data converter coupled to an RF power amplifier.

BACKGROUND

In certain wireless communication systems, a cellular base station transmitter lineup includes a digital signal processor connected to one or more radio frequency (RF) transmit front end circuits over one or more communication links. The digital signal processor produces digital samples that are communicated over the communication link(s) to RF transmit front end circuit(s). Each RF transmit front end circuit includes a data converter (e.g., a digital-to-analog converter), a transmit power amplifier, and an antenna. The data converter converts the digital samples received from the digital signal processor into analog signals, which are upconverted and amplified by the power amplifier, and communicated over the air interface by the antenna.

In some systems, the digital samples to be communicated from the digital signal processor to the data converter are sent according to one of a number of known serial link communications protocols, and in particular, a protocol that defines a serialized communication interface between a logic device and data converters (e.g., digital-to-analog converters and analog-to-digital converters). According to some serial link communications protocols, the logic device sends the digital samples to a serialized transmitter, which buffers, frames, and serializes the digital samples, and transmits the serialized sample stream over one or more "lanes" (i.e., where a "lane" is a differential signal pair for data transmission) to the data converter. As indicated above, the data converter, and more specifically a digital-to-analog converter, converts the digital samples to an analog signal. The analog signal is upconverted and amplified by the power transistor, and ultimately transmitted over the air interface by the antenna.

In some cases, control information that should be synchronized (or time-aligned) with the digital samples also may need to be sent from the digital signal processor to downstream components. This control information is sent over a communications link that is separate and distinct from the serial communication interface. Given ever-increasing wireless communication frequencies, system designers are increasingly finding it challenging to synchronize the analog signal (i.e., converted digital samples) and the control information at the downstream component. Accordingly, what are needed are improved apparatus and methods for communicating and synchronizing, at a downstream component, control information with an analog signal converted from digital samples sent over a serial communication link.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
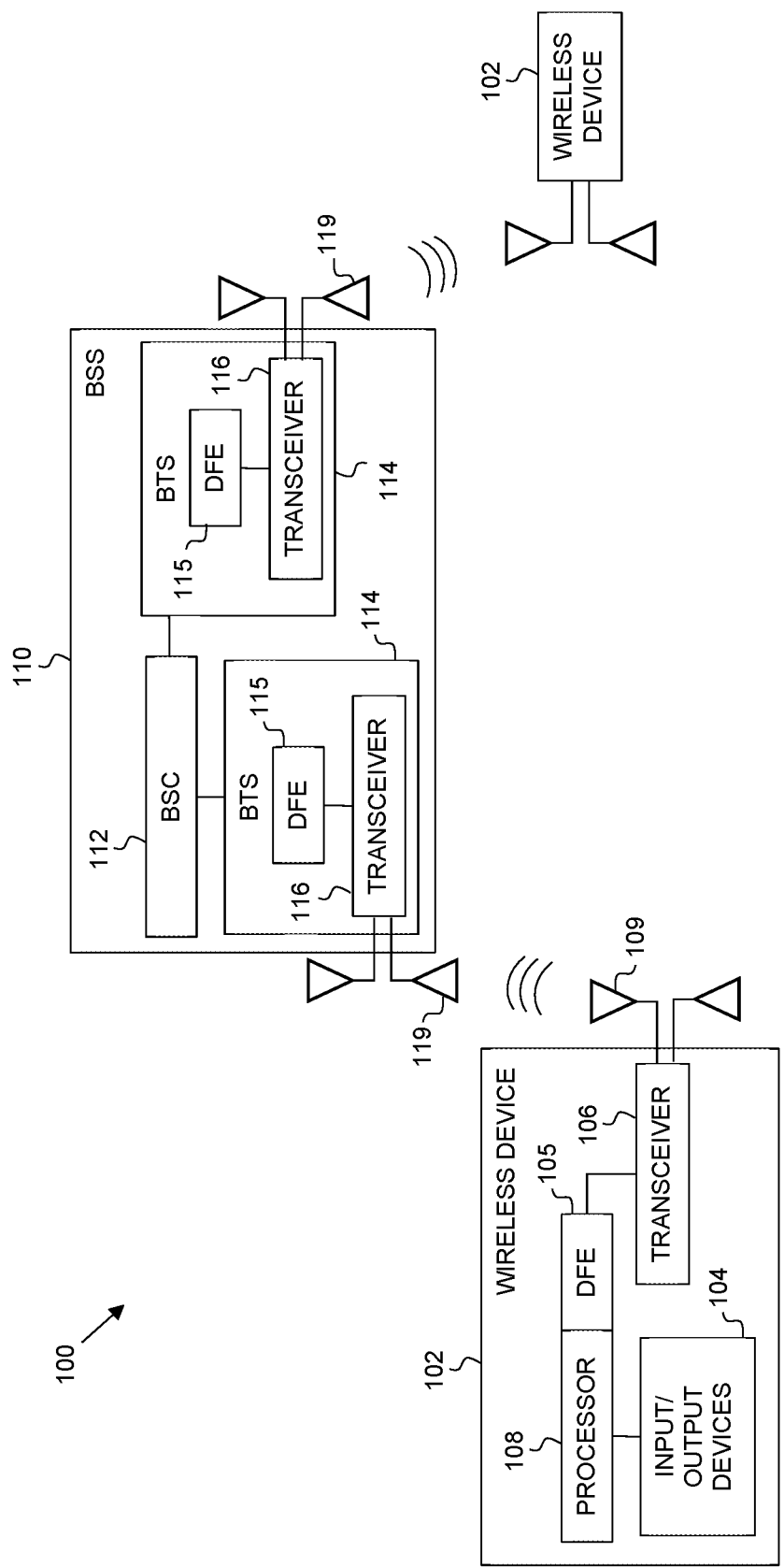
FIG. 1 is a simplified block diagram of a wireless communication system, in accordance with an example embodiment.

FIG. 1 is a simplified block diagram of a wireless communication system 100 in which a device 102, 110 includes a digital front end (DFE) 105, 115 that communicates both data and control information to a radio frequency (RF) transmitter lineup within an RF transceiver 106, 116 using a serial link communications protocol. More specifically, wireless communication system 100 includes a plurality of wireless devices or subscriber stations 102 (e.g., hand-held computers, personal digital assistants (PDAs), cellular telephones, etc.) that wirelessly communicate with one or more base station systems (BSS) 110 (e.g., evolved Node-B or eNB devices of an LTE (Long Term Evolution) network) using RF communication signals.

Each wireless device 102 may include a baseband processor 108 (e.g., a digital signal processor) connected through a DFE processor 105 to an RF transceiver 106, which in turn is connected to one or more antennas 109. The baseband processor 105 and the DFE processor 105 may be implemented as one or more integrated circuits to provide the digital processing functionality of the wireless device 102. The digital processing components consolidated on the DFE processor 105 may include one or more control processors and digital transmit/receive filters, as well as interface peripherals and other I/O for RF subsystem functions. Essentially, each RF transceiver 106 (including an RF transmitter and an RF receiver) is configured to receive or transmit voice, data, or both voice and data using the antenna(s) 109, and to provide an interface for signals between the antennas 109 and the DFE processor 105. More specifically, each RF transceiver 106 is configured to perform digital-to-analog conversion and amplification of signals from the DFE processor 105, and to amplify and perform analog-to-digital conversion of signals received over the air interface by an antenna 109. In addition, each wireless device 102 may include one or more input/output devices 104 (e.g., a camera, a keypad, display, etc.), along with other components (not shown).

The BSS 110 includes a base station controller (BSC) 112 and one or more base transceiver stations (BTS) 114, where each BTS 114 provides a communication interface between the BSC 112 and antennas 119. The BSC 112 may, for example, be configured to schedule communications for the wireless devices 102. Through antennas 109, 119, each wireless device 102 communicates with the BSC 112 of the BSS 110 via one of the BTS 114.

Essentially, each BTS 114 is configured to receive or transmit signals that include processed voice, data, or both voice and data through the antenna(s) 119, and to provide an interface for signals between the antennas 119 and the BSC 112. The BTS(s) 114 each include a DFE processor 115 which may be implemented as one or more integrated circuits to provide the digital processing functionality of the BTS 114. The digital processing components consolidated on the DFE processor 115 may include one or more control processors and digital transmit/receive filters, as well as interface peripherals and other I/O for RF subsystem functions. In addition, the BTS(s) 114 each include an RF transceiver 116 (including an RF transmitter and an RF receiver), which is configured to perform digital-to-analog conversion and amplification of signals from the DFE processor 115, and to amplify and perform analog-to-digital conversion of signals received over the air interface by an antenna 119. As will be described in more detail below, the DFE processor 115 and the RF transmitter of the RF transceiver 116 communicate digital samples over one or more serialized links, and according to an embodiment, control information may be multiplexed with at least some of the digital samples.

As will be appreciated, the digital sample and control information communication techniques disclosed herein with reference to the base station system 110 may also be used in connection with a wireless communication device, such as the wireless devices 102. To this end, and as mentioned earlier, each wireless device 102 may also include a DFE processor 105 connected to a corresponding RF transceiver 106, and the DFE processor 105 and the RF transmitter of the RF transceiver 106 also may be configured to communicate digital samples over one or more serialized links, where control information may be multiplexed with at least some of the digital samples.

Figure 2:
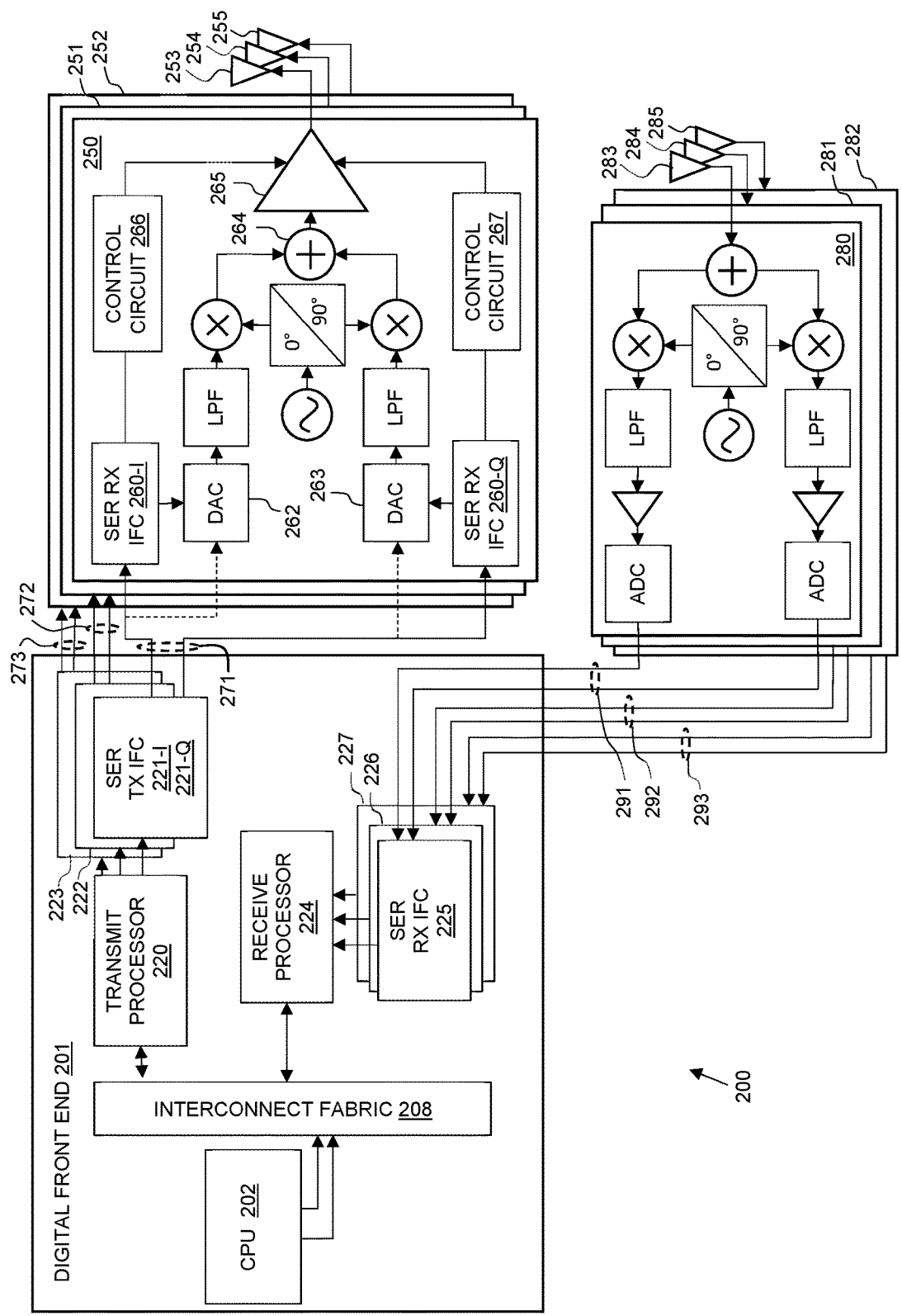
FIG. 2 is a block diagram of a multi-antenna radio frequency (RF) subsystem in which a digital front end (DFE) processor is connected to RF front end circuits through a serialized interface, in accordance with an example embodiment.

To further illustrate the digital sample and control information communication techniques disclosed herein, reference is now made to FIG. 2 which is a high level architecture block diagram illustration of a portion of a multi-antenna RF BTS 200 (e.g., BTS 114, FIG. 1). The BTS 200 is connected between a base station controller (e.g., BSC 112, FIG. 1) and transmit antennas 253-255 and receive antennas 283-285. The BTS 200 includes a DFE processor 201 (or more generally, a "digital data processor") connected through a plurality of lanes 271-273, 291-293 (i.e., differential signal line pairs for data transmission in one direction) to a plurality of RF transmit front end circuits 250-252 and RF receive front end circuits 280-282. As will be appreciated, the DFE processor 201 may be located in a radio head that is co-located with the base station controller (e.g., BSC 112, FIG. 1), or may be located at a remote radio head that is not co-located with the base station controller. For simplicity of illustration, the transmit antennas 253-255 and receive antennas 283-285 are shown as being separate from one another, but it will be appreciated that a shared plurality of antennas may be used for both signal transmission and reception in a shared or switched circuit arrangement. In such an arrangement, a duplexer (e.g., a circulator) and/or an RF switch between each antenna and a transceiver (consisting of a RF transmit front end circuit and a receive front end circuit) may be used to isolate the transmit signals from the receive signals during operation.

The DFE processor 201 essentially is a digital signal processor (or digital data processor), which is provided to perform digital signal processing for the BTS 200 across the separate transmit antennas 253-255 and/or receive antennas 283-285. To this end, the DFE processor 201 partitions transmit and receive signals to and from the antennas into transmit processing paths and receive processing paths, and communicates with a baseband modem (not illustrated) through a modem interface (e.g., a Common Public Radio Interface (CPRI) interface and/or JESD204 interface, not illustrated). For example, a base station controller (e.g., BSC 112, FIG. 1) may generate real (I) and imaginary (Q) samples (i.e., instantaneous values of a signal measured or determined at discrete times) for each transmit signal path, which are to be transmitted via diversity antennas 253-255.

The DFE processor 201 may include one or more control processors or CPUs 202 (e.g., one or more ARM processor cores), memory subsystems (e.g., instruction and data caches), memory controllers (not illustrated) for interfacing with external memory (e.g., flash memory, SDRAM, and so on), one or more modem interfaces, and I/O facilities (e.g., a host bridge) for I/O devices (not illustrated). As a general matter, any of a variety of memory designs and hierarchies may be employed in, or in conjunction with, with the DFE processor 201. Also, it will be appreciated that the I/O devices may include any desired I/O device, such as Ethernet, I2C, SPI, GPIO, and/or UART devices. All processor subsystems are linked by a multi-level interconnect fabric 208.

To digitally process transmit signals, the DFE processor 201 may also include a programmable transmit signal processing path for each transmit antenna 253-255, where each processing path includes a transmit signal processor 220, a serialized transmit (TX) interface 221-223 (SER TX IFC), a transmit lane 271-273 (i.e., a differential signal pair), and an RF transmit front end circuit 250-252. In this way, a first transmit signal processing path is formed by the connection of the transmit signal processor 220 and serialized TX interface 221 (including interface 221-I and 221-Q), which are connected over real and imaginary (I and Q) signal lines of a first transmit lane 271 to RF transmit front end circuit 250 and antenna 253, a second transmit signal processing path is formed by the connection of the transmit signal processor 220 and serialized TX interface 222, which are connected over differential signal lines of a second transmit lane 272 to RF transmit front end 251 and antenna 254, and a third transmit signal processing path is formed by the connection of the transmit signal processor 220 and serialized TX interface 223, which are connected over differential signal lines of a third transmit lane 273 to RF transmit front end 252 and antenna 255. Although three transmit signal processing paths are depicted in FIG. 2, fewer or more transmit signal processing paths may be implemented in other systems.

The transmit signal processor 220 may include one or more processors (e.g., vector processors) and associated memory (e.g., RAM) for performing carrier-related signal processing and antenna-specific processing on I and Q samples received from the baseband modem. In addition, and according to an embodiment, the transmit signal processor 220 may produce control information (in the form of one or more control bits) that is correlated in time with the processed samples. According to an embodiment, the transmit signal processor 220 determines the values of the control bit(s) based on the instantaneous voltage values (or magnitudes) of the samples being processed by the transmit signal processor 220. For example, as will be discussed in more detail later, the control bits may be selected to configure an externally controllable sub-circuit in the amplifier (e.g., sub-circuits 520, 720, FIGS. 5, 7, described in more detail below) in a first state when the instantaneous voltage value is relatively high (e.g., approaching or above a transition point α, FIGS. 6A, 6B), and may be selected to configure the externally controllable sub-circuit in the amplifier in a second state when the instantaneous voltage value is relatively low (e.g., below transition point α, FIGS. 6A, 6B). In other embodiments, the transmit signal processor 220 determines the values of the control bit(s) based on the envelope amplitude of the transmit signal. For example, the control bits may be selected to configure the externally controllable sub-circuit in the amplifier in a first state when the envelope amplitude is relatively high, and may be selected to configure the externally controllable sub-circuit in the amplifier in a second state when the envelope amplitude is relatively low.

Once signal processing is completed, and as will be described in more detail in conjunction with FIG. 3, the transmit signal processor 220 may send the processed I and Q samples and the control bit(s) to associated transmit-side serialized interfaces (e.g., serialized TX interface 221-I and 221-Q, respectively). Basically, each of serialized TX interface 221-I and serialized TX interface 221-Q comprise a circuit that serializes input frames (e.g., sets of consecutive words/octets in which the position of each word/octet can be identified by reference to a frame alignment signal) and transports the resulting bit stream across a lane (e.g., lane 271). According to an embodiment, each serialized TX interface 221-I and serialized TX interface 221-Q implements a JESD204 serial link communications protocol (e.g., according to a JESD204A (2006), JESD204B (2012), or JESD204C (2017) serial interface for data converter standard, issued by JEDEC Solid State Technology Association, including future versions). The JESD204 serial link communications protocol represents one family of serial link communications protocols. It should be appreciated that, although a JESD204 serial link communications protocol is used as an example herein, the data interface may be implemented with other suitable serialized interfaces, or alternatively may be implemented with a parallel interface, or with other protocols with similar capabilities.

Figure 4A:
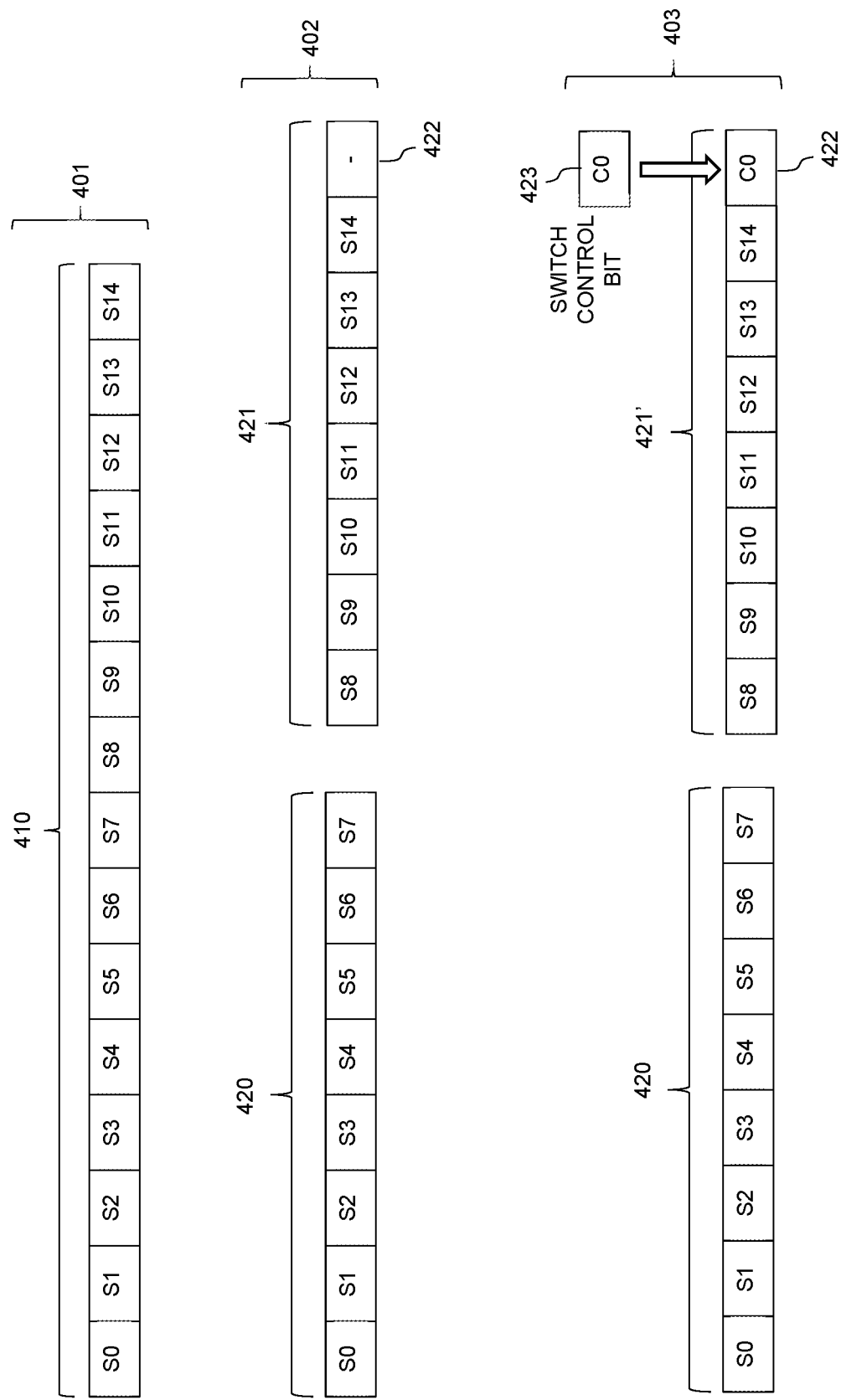
FIG. 4A depicts several data formats associated with combining converter samples with associated control bits for communication over a serialized interface, in accordance with an example embodiment.
Figure 4B:
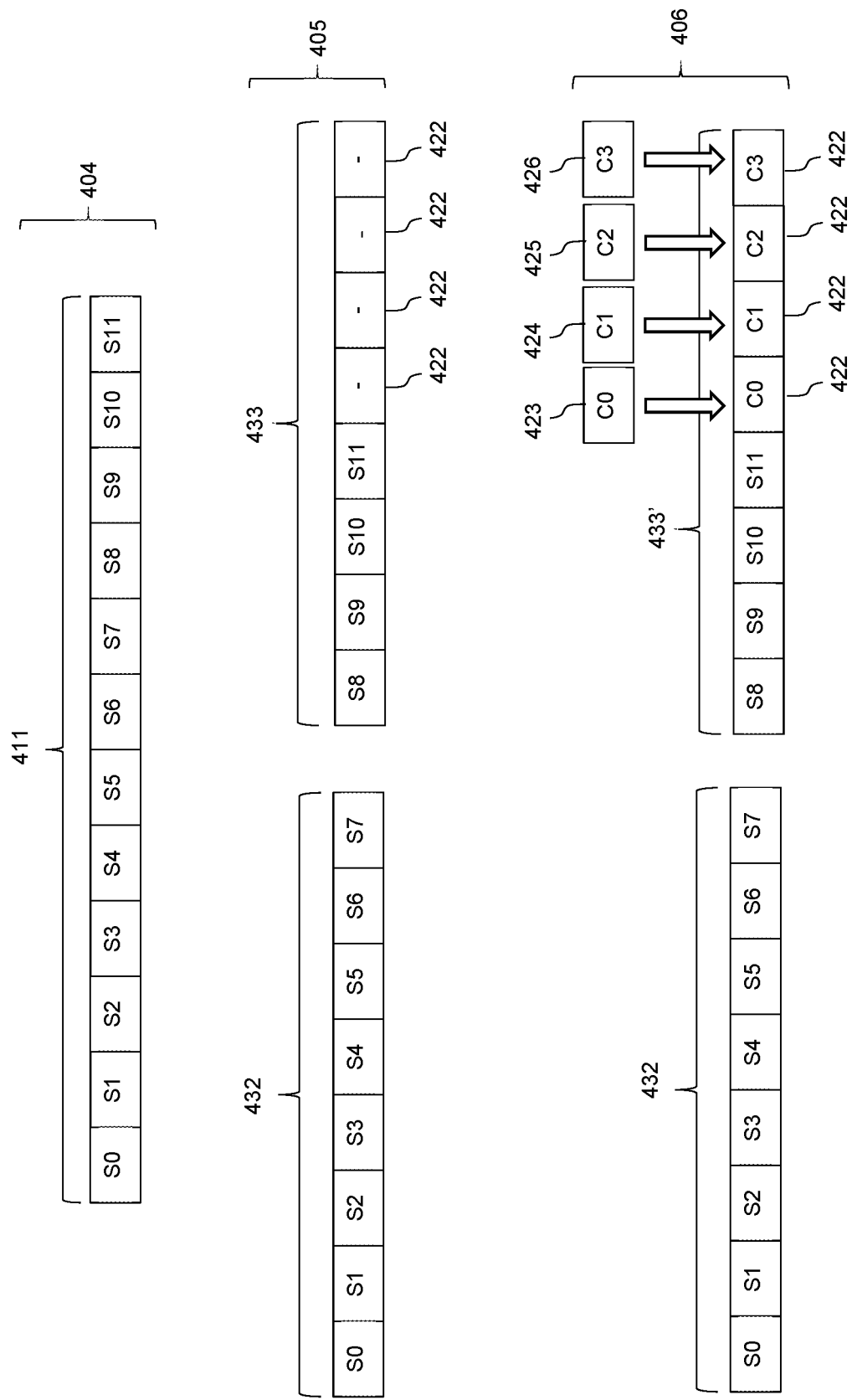
FIG. 4B depicts several data formats associated with combining converter samples with associated control bits for communication over a serialized interface, in accordance with another example embodiment.
Figure 4C:
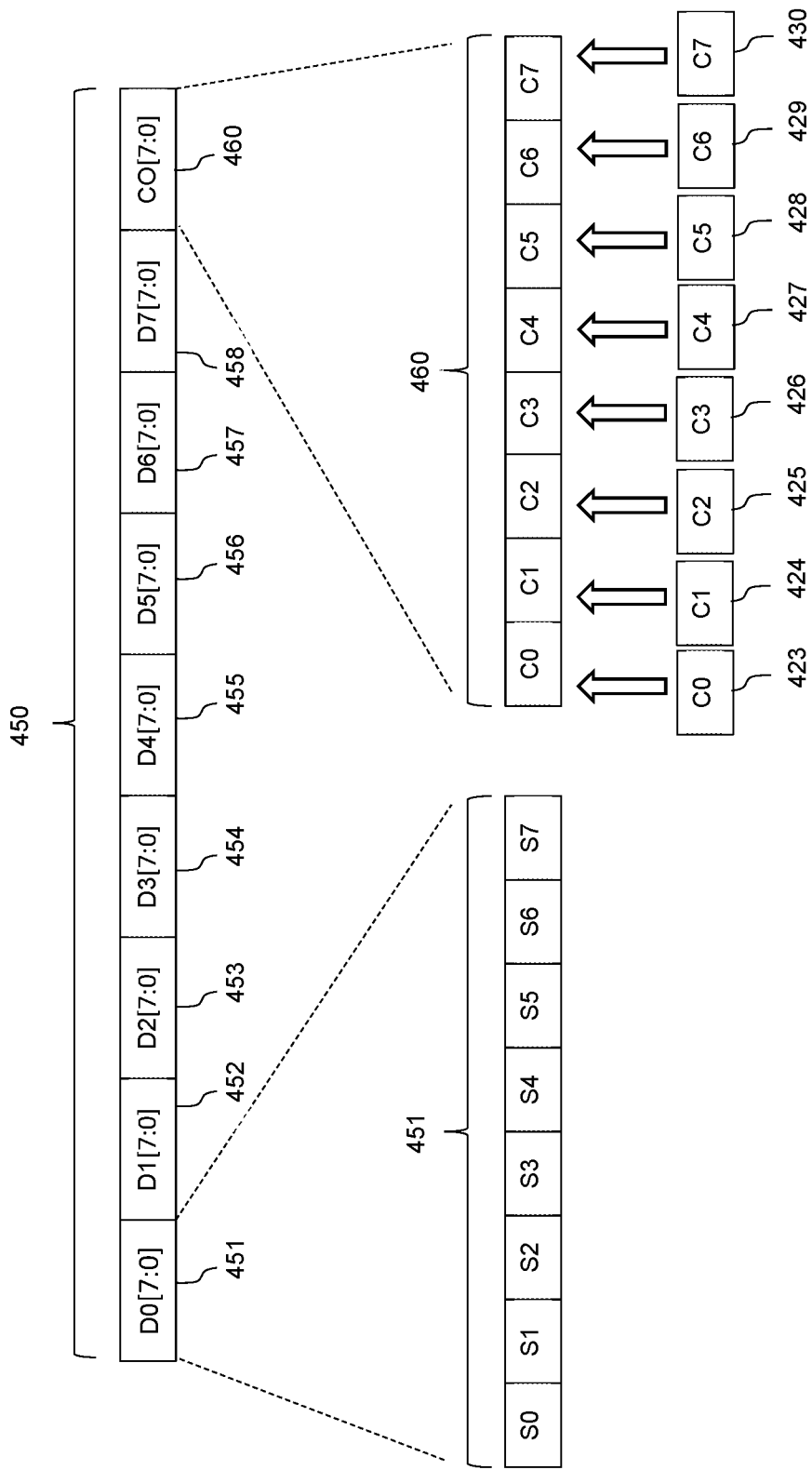
FIG. 4C depicts a data frame that includes a control data packet, in accordance with yet another example embodiment.

According to an embodiment, and as depicted in FIGS. 4A and 4B, described later, the serialized TX interface 221-I may combine (e.g., multiplex) the control bit(s) with I samples, the serialized TX interface 221-Q may combine (e.g., multiplex) the control bit(s) with Q samples, or both serialized TX interface 221-I and serialized TX interface 221-Q may combine control bits with both I and Q samples. Serialized TX interface 221-I then frames, optionally encodes, and serializes the I data stream, and transfers the serialized I data stream to the transceiver (e.g., RF transmit front end circuit 250) over one of the differential signal lines of the first transmit lane 271. Serialized TX interface 221-Q frames, optionally encodes, and serializes the Q data stream and transfers the serialized Q data stream to the transceiver over the other of the differential signal lines of the first transmit lane 271. According to another embodiment, and as depicted in FIG. 4C, described later, rather than combining the control bit(s) with either or both of the I and/or Q samples, the serialized TX interface 221 may interject one or more control octets and/or one or more control words into a data frame (and thus into either or both of the I and/or Q data streams) that include the control information (e.g., one or more octets and/or words that do not include sample data, but only include control information). As used herein, the term "control bit(s)" includes any set of one or more control bits, and thus the term "control bit(s)" should be interpreted to include control octets, control words, and other-sized sets of control bits. It should be understood that a particular data link may consist of a single lane (e.g., lane 271) or multiple lanes (e.g., multiple ones of lanes 271-273) as needed to support the required data throughput. Further, each lane 271-273 may convey synchronization and alignment data that allows transmitted data to be reassembled in the RF transmit front end circuit 250, thus enabling the original data samples to be reproduced.

According to an embodiment, RF transmit front end circuit 250 includes one or two serialized receive (RX) interfaces 260-I, 260-Q (SER RX IFC), one or more control circuits 266, 267, digital-to-analog converters (DACs) 262, 263, low pass filters (LPFs), an oscillator, mixers, a signal combiner 264, and a power amplifier 265. Basically, each of serialized RX interface 260-I and serialized RX interface 260-Q comprise a circuit attached to a lane (e.g., lane 271), where the circuit is configured to reconstruct a serial bit stream into time-aligned frames. According to an embodiment, each serialized RX interface 260-I and serialized RX interface 260-Q implements a JESD204 serial link communications protocol, although other protocols could be implemented as well, as mentioned above. Serialized RX interface 260-I is configured to receive the I data stream from one of the differential signal lines of the first transmit lane 271. Serialized RX interface 260-Q, when included, is configured to receive the Q sample stream from the other of the differential signal lines of the first transmit lane 271. In embodiments in which the serialized TX interface 221 combines control bit(s) with only the I sample stream (but not the Q sample stream), serialized RX interface 260-Q and control circuit 267 may be excluded, and the associated differential signal line of the first transmit lane 271 may instead be directly coupled to DAC 263, as indicated by the dashed-line arrow. In other embodiments in which the serialized TX interface 221 combines control bit(s) with only the Q sample stream (but not the I sample stream), serialized RX interface 260-I and control circuit 266 may be excluded, and the associated differential signal line of the first transmit lane 271 may instead be directly coupled to DAC 262, as indicated by the other dashed-line arrow.

Upon receiving an I or Q serialized data stream, each serialized RX interface 260-I, 260-Q is configured to separate the control bit(s) (e.g., bits 423-430, FIGS. 4A-C) from the sample bits within the serialized data stream, and to re-construct the I or Q samples from the extracted sample bits. Each serialized RX interface 260-I, 260-Q sends the I or Q samples to DAC 262 or 263. Each DAC 262, 263 includes a circuit for converting a digital sampled data stream to an analog signal. Because the analog signals are converted from a complex data stream, each DAC 262, 263 may be defined as a subblock accepting either the real (I) or the imaginary (Q) component of the data stream. Each DAC 262, 263 performs a digital-to-analog conversion on each received sample, and the resulting analog samples are filtered (e.g., by an LPF). The oscillator produces an RF sinusoidal signal that is used to upconvert (to RF) the analog I and Q sample streams. The filtered, analog I sample stream is mixed with the RF signal, and the filtered, analog Q sample stream is mixed with a 90 degree delayed version of the RF signal in order to re-align the I and Q sample streams. Combiner 264 then combines the two sample streams and provides a single RF input signal to the power amplifier 265.

As mentioned above, the power amplifier 265 may include one or more externally controllable sub-circuits (e.g., circuits 520, 720, FIGS. 5, 7), the operation of which is controlled using the control bit(s) received in the I and/or Q serialized data streams. Accordingly, upon separating the control bit(s) from the sample bits within a serialized data stream, each serialized RX interface 260-I, 260-Q sends the control bit(s) to the control circuit 266, 267. According to an embodiment, each control circuit 266, 267 may convert the received control bit(s) to control signals, and may send the control signals to the power amplifier 265 so that the control signals are time-aligned with the converted I or Q samples. In other words, the control circuit 266, 267 may buffer, and more specifically impart a programmable delay, to a control signal to ensure that the amplifier 265 performs a desired circuit modification operation (as controlled by the control signal) simultaneously with amplifying the converted I or Q sample from the same word that the control bit(s) associated with the control signal were extracted.

Turning now to the receive side of the system of FIG. 2, received signals may be received and digitally processed at the DFE processor 201 with a programmable receive signal processing path for each receive antenna 283-285. Each receive signal processing path is formed with a RF receive front end circuit 280-282 that is connected to a receive antenna 283-285, a receive lane 291-293 (i.e., a differential signal pair), an associated serialized RX interface 225-227 (e.g., a JESD204 RX interface), and a receive signal processor 224. In this way, a first receive signal processing path is formed by the connection of the antenna 283 and RF receive front end circuit 280 which are connected over differential signal lines of a first receive lane 291 to the serialized RX interface 225 and receive signal processor 224, a second receive signal processing path is formed by the antenna 284 and RF receive front end 281 which are connected over differential signal lines of a second receive lane 292 to the serialized RX interface 227 and receive signal processor 224, and a third receive signal processing path is formed by the antenna 285 and RF receive front end 282 which are connected over differential signal lines of a third receive lane 293 to the serialized RX interface 227 and receive signal processor 224. Although three receive signal processing paths are depicted in FIG. 2, fewer or more receive signal processing paths may be implemented in other systems.

Each RF receive front end circuit 280-282 includes RF conversion circuit components (e.g., a splitter, an oscillator, mixers, low pass filters (LPF), amplifiers, analog-to digital converters (ADCs), etc.) that process an RF signal from the corresponding antenna (e.g., antenna 283) by separating the signal into I and Q signal components, and converting the I and Q signals into digitized serial I and Q data streams for processing by the DFE processor 201.

The receive signal processor 224 may include one or more processors (e.g., vector processors) and associated memory (e.g., RAM) for performing receive signal processing on IQ samples received from each RF receive front end circuit 280-282 over one of the serialized RX interfaces 225-227. Once signal processing is completed, the receive signal processor 224 may send the processed samples to the baseband modem.

With multiple transmit and/or receive signal paths between the DFE processor 201 and antennas 253-255, 283-285, there may be different signal path latencies on each signal path due to different hardware implementations and link delays for each path. For example, different inherent signal path delays can arise along each signal path due to digital filtering, analog-to-digital or digital-to-analog converters, analog components, coaxial length, and other wire delays. To avoid potential problems that may otherwise arise due to different inherent delays in each transmit signal path, a software-based and/or hardware-based synchronization may be implemented by the DFE processor 201 that controls the serialized interfaces 221-223, 225-227 in order to provide timing alignment of the data into and out of the DFE processor 201.

Figure 3:
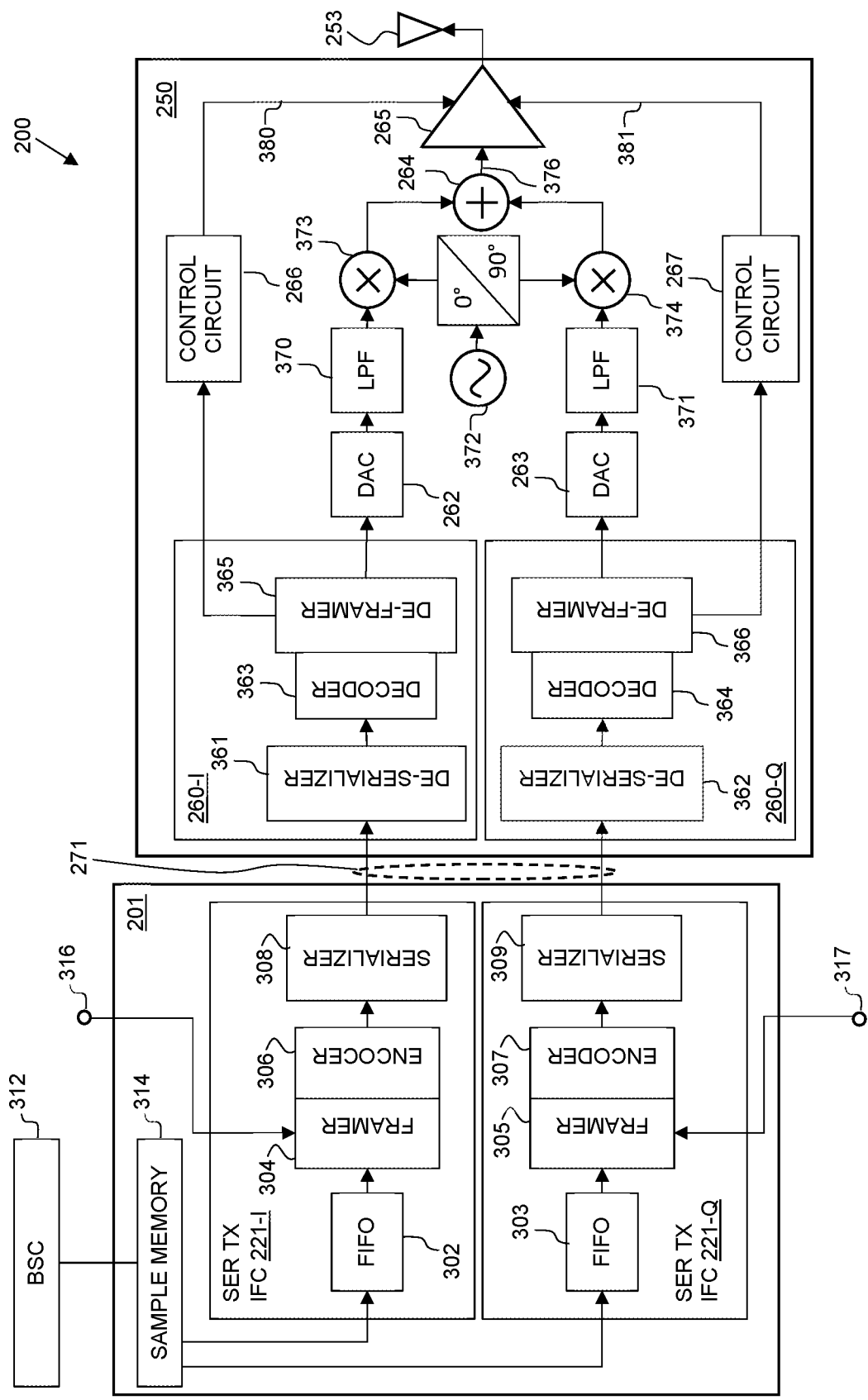
FIG. 3 is a more detailed block diagram of a serialized transmitter and a serialized receiver coupled between a processor and an RF transmit front end circuit, in accordance with an example embodiment.

To provide additional details of selected embodiments, reference is now made to FIG. 3 which depicts a block diagram of a portion of RF BTS 200 (e.g., BTS 114, FIG. 1) in more detail. To avoid obfuscating the inventive subject matter, FIG. 3 depicts only one transmit signal path within BTS 200, which includes serialized TX interfaces 221-I, 221-Q (within DFE 201) coupled to serialized RX interfaces 260-I, 260-Q (within RF transmit front end 250).

As discussed previously in conjunction with FIG. 2, RF BTS 200 includes DFE 201 and RF transmit front end circuit 250, which are communicatively coupled through IQ signal lines of transmit lane 271. Among other components, as discussed above, DFE 201 includes sample memory 314, serialized TX interface 221-I, and serialized TX interface 221-Q. Sample memory 314 (e.g., RAM) is configured to store I and Q data samples for transmission to the RF transmit front end circuit 250, and ultimately, over the air interface via antenna 253.

In operation, the base station controller 312 (e.g., BSC 112, FIG. 1) generates the I and Q data samples, which are to be transmitted via antenna 253. According to an embodiment, each I and Q data sample includes N bits, where N may be any integer that is not an integer multiple of the number of bits, M, in a data packet (e.g., N may be an integer between 7 bits and 15 bits), according to various embodiments. In some of the examples described below, N=15 bits or N=12 bits (i.e., each I and Q sample is a 15-bit or 12-bit sample). However, in other examples, N may be less than or greater than 12 or 15 bits. Either way, the I and Q data samples for the transmit signal path are stored in sample memory 314 (e.g., including RAM with an I-sample buffer and a Q-sample buffer).

Each of serialized TX interface 221-I and serialized TX interface 221-Q includes a first-in first-out (FIFO) input buffer 302, 303 connected in series with a switched-framer module 304, 305 (referred to simply as "framer", below), an encoder 306, 307, and a serializer 308, 309. Each FIFO input buffer 302, 303 receives I or Q data (and more specifically, a stream of I or Q data samples), respectively, from the sample memory 314 (e.g., over the interconnect fabric 208, FIG. 2) and stores the I or Q data as one or more data packets. Each data packet may have a same number of bits, M. In a specific embodiment, each data packet is an octet (i.e., a group of eight adjacent binary digits, similar to a byte), and accordingly M=8 bits. In other example embodiments, M may be less than or greater than 8 bits.

According to an embodiment, the number of bits in a data sample, N, is not equal to the number of bits in a data packet, M According to a further embodiment, N is also not equal to integer multiples of M (e.g., 2×M, 3×M, and so on). Accordingly, in such example embodiments, when the N-bit data sample is stored in one or more M-bit data packets in a FIFO input buffer 302 or 303, the N bits of the sample will only partially fill the M available bits of the one or more data packets, and at least one bit of the one or more data packets will be "unfilled" or "empty" (i.e., devoid of data sample bits). The number of unfilled or empty bits of a data packet may include as few as one bit, or as many as M−1 bits, in various embodiments.

FIG. 4A, which should be viewed simultaneously with FIG. 3, is provided to further illustrate the data formatting and operations that are performed by serialized TX interface 221-I and serialized TX interface 221-Q, in accordance with an example embodiment. The example depicted in FIG. 4A corresponds to an embodiment in which the length of each data sample is 15 bits (i.e., N=15) and the length of each data packet is 8 bits (i.e., M=8). Specifically, data format 401 depicts a data sample 410 (I or Q) that includes 15 bits (S0-S14), and data format 402 depicts the bits of data sample 410 stored (e.g., in FIFO 302 or 303) in two, equal-sized data packets 420, 421. More specifically, the first 8 bits of the data sample 410 are stored in the first data packet 420, and the next 7 bits of the data sample 410 are stored in the second data packet 421. This leaves one bit 422 of data packet 421 unfilled. It should be noted that, although the last bit 422 of data packet 421 is shown to be unfilled in FIG. 4A, the storage of the bits of data sample 410 into data packets 420, 421 could be modified so that a different bit of either data packet 420 or 421 is unfilled, instead. For example, in other embodiments, the unfilled bit may be located in data packet 420, may be located at the beginning of either data packet 420, 421, or may be located in the middle of either data packet 420, 421.

In the example of FIG. 4A, data packet 421 includes only one unfilled bit (e.g., bit 422). In other embodiments, such as the embodiment shown in FIG. 4B, the length of the data sample may result in more than one unfilled bit (e.g., anywhere from 2 to 7 unfilled bits) in the data packet(s) in which the data sample is stored. More specifically, in the embodiment of FIG. 4B, the length of each data sample is only 12 bits (i.e., N=12) and the length of each data packet is 8 bits (i.e., M=8). Specifically, data format 404 depicts a data sample 411 (I or Q) that includes 12 bits (S0-S11), and data format 405 depicts the bits of data sample 411 stored (e.g., in FIFO 302 or 303) in two, equal-sized data packets 432, 433. More specifically, the first 8 bits of the data sample 411 are stored in the first data packet 432, and the next 4 bits of the data sample 411 are stored in the second data packet 433. This leaves four bits 422 of data packet 433 unfilled. It should be noted that, although the last four bits 422 of data packet 433 are shown to be unfilled in FIG. 4B, the storage of the bits of data sample 411 into data packets 432, 433 could be modified so that different bits of either or both data packets 432 or 433 are unfilled, instead. For example, when the length of the data sample results in more than one unfilled bit, as in the example of FIG. 4B, the storage of bits of the data sample 411 into data packets 432 and 433 could result in one or more unfilled bits in data packet 432 and one or more unfilled bits in data packet 433. Further, although FIG. 4B shows an embodiment in which the unfilled bits are consecutive and occur at the end of the second data packet 433, in other embodiments, the unfilled bits may be non-consecutive, and/or may be located at the beginning of a data packet 432, 433 or in the middle of a data packet 432, 433, and/or the unfilled bits may be present in both of the data packets 432, 433.

Referring again also to FIG. 3, each framer 304, 305 receives a stream of I or Q data packets (e.g., data packets 420, 421, 432, 433, FIGS. 4A, 4B) from a FIFO input buffer 302, 303, and adds markers to frame each data packet. In addition, and according to an embodiment, each framer 304, 305 also receives one or more control bits from the transmit processor 220 through inputs 316, 317, where the control bit(s) are aligned, in time, with the I or Q data packets that are received from the FIFO input buffer 302, 303. The framer 304, 305 is configured to combine (or multiplex) the received control bit(s) into one or more of the received data packets. More specifically, each framer 304, 305 inserts the control bit(s) into one or more of the unfilled bits (e.g., bits 422, FIGS. 4A, 4B) of the received data packets. For example, each framer 304, 305 may include a multiplexer (not shown), which receives the I or Q data packets as one input and the control bit(s) as another input, and outputs modified versions of the I or Q data packets that include the inserted the control bit(s). Referring again to FIG. 4A, for example, data format 403 depicts data packets 420, 421', where data packet 421' includes a control bit 423 (C0) inserted into the previously unfilled bit 422 of data packet 421. Similarly, in FIG. 4B, for example, data format 406 depicts data packets 432, 433', where data packet 433' includes four control bits (C0, C1, C2, C3) inserted into the previously unfilled bits 422 of data packet 433.

In another embodiment, each framer 304, 305 may insert control bit(s) received from the transmit processor 220 into one or more "control data packets," which may be referred to herein more specifically as "control octets," or "control words", depending on their length. Insertion of control bit(s) into a control data packet may be done in addition to or instead of inserting the control bit(s) into unfilled bit(s) of the I and/or Q data packets. For example, FIG. 4C depicts a data frame 450 that includes multiple data packets 451, 452, 453, 454, 455, 456, 457, 458 and a control octet 460, in accordance with yet another example embodiment. In the illustrated embodiment, each data packet 451-458 is identified as "Dx", where x indicates the sequential location of the data packet 451-458 in the data frame 450. In the illustrated embodiment, the data frame 450 includes 8 data packets (D0-D7) and one control octet (CO), and the length of each data packet or control octet is 8 bits (i.e., M=8). In other embodiments, a data frame may include more or fewer than 8 data packets. Further, in other embodiments, a data frame may include more than one control octet and/or control word. Further, although control octet 460 is positioned at the end of the data frame 450 in the illustrated embodiment, in other embodiments, the control octet(s) 460 (or control word(s)) may be positioned at the beginning and/or in the middle of the data frame 450.

Again, as indicated in expanded data packet 451, each data packet 451-458 is configured to store multiple bits of a data sample (e.g., bits S0-S7 in data packet 451). In an embodiment in which the length of each data sample is 8 bits (i.e., N=8), data frame 450 is configured to convey 8 data samples. In an alternate embodiment in which the length of each data sample is 16 bits (i.e., N=16), data frame 450 is configured to convey 4 data samples. In other embodiments, a data frame may include more or fewer than 8 data packets, and/or each data packet may be smaller or larger than 8 bits.

As mentioned above, and according to an embodiment, data frame 450 also includes a control data packet, and more specifically a control octet 460, identified as "CO", which has a length of 8 bits. As indicated in expanded control octet 460, the control octet 460 is configured to store multiple (e.g., up to 8) control bits (e.g., control bits C0-C7 423-430). Prior to transmitting the data frame 450, the framer (e.g., framer 304, 305, FIG. 3) insert control bit(s) received from the transmit processor 220 (e.g., control bits 423, 424, 425, 426, 427, 428, 429, 4300 into the bits of control octet 460 (i.e., into the bits of a control data packet).

Referring again to FIG. 3, after inserting the control bit(s) into the data packet(s), each framer 304, 305 conveys the M-bit data packets to encoders 306, 307. Regardless of whether the control bits are encoded according to the embodiment of FIG. 4A, FIG. 4B, or FIG. 4C, each encoder 306, 307 may be configured to convert the M-bit data packets into encoded symbols with more than M bits. Encoding in this manner may enhance DC-balance and provide bounded disparity, while providing a sufficient number of state changes to allow reasonable clock recovery. For example, each encoder 306, 307 may be an 8b/10b encoder, in an embodiment, which receives 8-bit data packets (e.g., data packets 420, 421', FIG. 4A, data packets 432, 433', FIG. 4B, or data packets 451-458, 460, FIG. 4C), and converts each 8-bit data packet into a 10-bit symbol. In other embodiments, each of the encoders 306, 307 may be a 64b66b encoder, which converts a 64-bit output from a framer 304, 305 to 66-bit format, or each of the encoders 306, 307 may be a 64b80b encoder, which converts a 64-bit output from a framer 304, 305 to 80-bit format. The 8b/10b link layer organizes the data into multiframes, which contain K×F octets, where K is the number of frames in a multiframe, and F is the number of octets in each frame. The 64b/66b and 64b/80b link layers organize the data into multiblocks, which contain 32 blocks, with each block containing eight octets. Other encoding schemes may be implemented, as well. In some embodiments, the data is communicated without encoding, in which case encoders 306, 307 and decoders 363, 364 may be excluded.

The encoded symbols produced by encoders 306, 307 (or the framed data if encoding is not implemented) are provided to serializers 308, 309, which proceed to communicate the encoded symbols to the RF transmit front end circuit 250 in a serial manner over the IQ signal lines of the transmit lane 271.

As discussed previously, the RF transmit front end circuit 250 includes serialized RX interfaces 260-I and/or 260-Q, which are coupled to the I and Q signal lines, respectively, of transmit lane 271. Essentially, upon receiving I or Q serialized symbols, each serialized RX interface 260-I, 260-Q is configured to decode the symbols (assuming prior encoding), which results in a data packet stream in which control bit(s) are embedded with data, as discussed above. When the control bit(s) are embedded within one or more data packets (e.g., data packet 421', 433', FIGS. 4A, 4B), as discussed above, then each serialized RC interface 260-I, 260-Q is configured to separate the control bit(s) from the sample bits within the data packet stream, and to re-construct the I or Q samples from the extracted sample bits. When the control bit(s) are included within one or more control data packets (e.g., control octet 460, FIG. 4C), then each serialized RC interface 260-I, 260-Q is configured to separate the control data packet(s) (which include one or more control bits) from the sample data-bearing packets in the data packet stream, and to re-construct the I or Q samples from the data-bearing packets. The RF transmit front end circuit 250 is further configured to convert the I and Q samples to analog signals, and to upconvert, combine, and amplify the analog I and Q samples. In addition, the RF transmit front end circuit 250 is configured to convert the control bit(s) using one or more control circuits 266, 267 into control signals (e.g., analog or digital control signals) that are provided to the amplifier 265. The amplifier 265 utilizes the control signals to control one or more aspects of the amplification process, according to an embodiment. Ultimately, the amplified RF signal produced by the amplifier 265 is conveyed to antenna 253, which transmits the amplified RF signal over the air interface.

Each of serialized RX interface 260-I and serialized RX interface 260-Q includes a de-serializer 361, 362 connected in series with a decoder 363, 364, and a switched de-framer module 365, 366 (referred to simply as "de-framer", below). Essentially, these components are configured to re-construct the data packets that were previously supplied to the framer 304 on the transmit side, and also to extract the control bits from the I and/or Q data streams. More particularly, the de-serializers 361, 362 receive the encoded, serialized symbols that were transmitted by the DFE processor 201 over the IQ signal lines of the transmit lane 271. The de-serializers 361, 362 convert the serialized symbol streams into discrete symbols. Assuming encoding was performed on the transmit side, the decoders 363, 364 then decode the symbols by performing an inverse operation to the encoding operation previously performed by encoders 306, 307. For example, when the encoders 306, 307 are 8b/10b encoders, decoders 363, 364 should be 8b/10b decoders, which produce a stream of 8-bit decoded data packets (e.g., reconstructed versions of data packets 420, 421', 432, 433', 451-458, 460, FIGS. 4A-C) from received 10-bit symbols. Alternatively, the encoders 363, 364 may be 64b66b decoders (i.e., producing 64-bit data packets from 66-bit symbols), 64b80b decoders (i.e., producing 64-bit data packets from 80-bit symbols), or other compatible types of decoders.

The reconstructed data packets are provided to de-framers 365, 366, respectively. According to an embodiment, each de-framer 365, 366 is configured to separate (or de-multiplex) the control bit(s) from the received data packets. More specifically, each de-framer 365, 366 extracts the embedded control bit(s) from the one or more bits of the received data packets (e.g., control bits 423-426 from bit(s) 422, FIGS. 4A. 4B), or extracts the control bit(s) from the received data packets (e.g., control bits 423-430 from control data packet 460, FIG. 4C). For example, according to some embodiments, each de-framer 365, 366 may include a de-multiplexer (not shown), which receives the I or Q data packets from a decoder 363, 364, extracts the control bit(s) (e.g., C0 423, FIG. 4A, or C0-C3 423-426, FIG. 4B) from one or more designated bits (e.g., bit(s) 422) of the I or Q data packets, and conveys the control bit(s) to the corresponding control circuit 266, 267. According to alternate embodiments, the de-multiplexer (not shown) receives the data packets from a decoder 363, 364, extracts the control bit(s) (e.g., C0-C7 423-430, FIG. 4C) from the control data packet(s) (e.g., data packet 460, FIG. 4C), and conveys the control bit(s) to the corresponding control circuit 266, 267. Although separate control circuits 266, 267 are shown in FIG. 3, in some embodiments, a single control circuit (e.g., either control circuit 266 or 267) may be implemented, even though control bits are conveyed in both the I and Q data packets. For example, an embodiment of system 200 may include only control circuit 266, and both de-framers 365 and 366 may be coupled to the single control circuit 266. In another embodiment, system 200 may include only control circuit 267, and both de-framers 365 and 366 may be coupled to the single control circuit 267. In either of these two embodiments, the control circuit 266 or 267 may combine control bits extracted from corresponding, time-aligned I and Q data packets into a multi-bit control signal.

In addition to extracting the control bit(s), when each data sample includes data from multiple data packets (e.g., the length of a data sample, N, is 15 bits, and the length of each data packet, M, is 8 bits), each de-framer 365, 366 reconstructs each data sample from the data bits within multiple (e.g., two or more) consecutive I or Q data packets. For example, referring again to FIG. 4A, each de-framer 365, 366 may combine the 15 data bits from reconstructed data packets 420, 421 (e.g., bits S0-S14) into a reconstructed data sample that should be identical to data sample 410. As another example, referring again to FIG. 4B, each de-framer 365, 366 may combine the 12 data bits from reconstructed data packets 432, 433 (e.g., bits S0-S11) into a reconstructed data sample that should be identical to data sample 411. Similar combinations of data from multiple data packets may be performed according to the embodiments discussed in conjunction with FIG. 4C, as well.

The de-framers 365, 366 provide the reconstructed I and Q data samples to digital-to-analog converters 262, 263 (DACs), respectively. As discussed previously, each DAC 262, 263 then performs a digital-to-analog conversion on each received sample, and the resulting analog samples are filtered (e.g., by LPFs 370, 371). Oscillator 372 produces an RF sinusoidal signal that is used to upconvert (to RF) the analog I and Q sample streams produced by DACs 262, 263 and LPFs 370, 371. The filtered, analog I sample stream is mixed, using mixer 373, with the RF signal, and the filtered, analog Q sample stream is mixed, using mixer 374, with a 90 degree delayed version of the RF signal in order to re-align the upconverted I and Q sample streams in time. Combiner 264 then combines the two sample streams and provides a single RF signal 376 to the power amplifier 265.

As mentioned above, the power amplifier 265 may include one or more externally controllable sub-circuits (e.g., circuits 520, 720, FIGS. 5, 7), the operation of which is controlled using the control bit(s) extracted from the I and/or Q serialized data streams by de-framers 365, 366 and provided to control circuits 266, 267. According to an embodiment, each control circuit 266, 267 may convert the received control bit(s) to control signals (e.g., TTL signals with low and high logic levels). In some embodiments, the control circuits 266, 267 may include logic circuits configured to perform the conversion, and in other embodiments, each control circuit 266, 267 may include a look-up table (LUT), which correlates control bit values to control signal characteristics. In the latter embodiment, each control circuit 266, 267 may include additional circuitry to produce the control signals with the signal characteristics that are associated (e.g., in the LUT) with the control bit values. Either way, each control circuit 266, 267 sends the control signals 380, 381 to the power amplifier 265 so that the control signals are synchronized (or time-aligned) with the RF signal provided by the combiner 264 to the power amplifier 265. According to an embodiment, each control circuit 266, 267 may impart a programmable delay to a control signal 380, 381 to ensure that the amplifier 265 performs a desired operation (as controlled by the control signals 380, 381) simultaneously with amplifying the converted I and/or Q sample(s) from which the associated control bit(s) were extracted (or the I and/or Q sample(s) in the same frame as the extracted control data word). The programmable delay should substantially equal the cumulative sample processing delays through the DACs 262, 263, LPFs 370, 371, mixers 373, 374, combiner 364, and portions of amplifier 265 that precede the point(s) at which the amplifier control circuit (e.g., switch 522, FIG. 5 or variable phase shifters/attenuators 721-724) is tied into the transmit path. In some systems, this cumulative sample processing delay may be substantially fixed, and accordingly the programmable delay may be a substantially fixed value. In other systems, this cumulative sample processing delay may be variable but determinable (e.g., using a feedback circuit, not shown, between the amplifier 265 and the DFE 201, for example), and accordingly the programmable delay may be a dynamic variable value. Either way, upon amplification of the RF signal by power amplifier 265, the amplified RF signal is provided to antenna 253 for radiation over the air interface.

Figure 5:
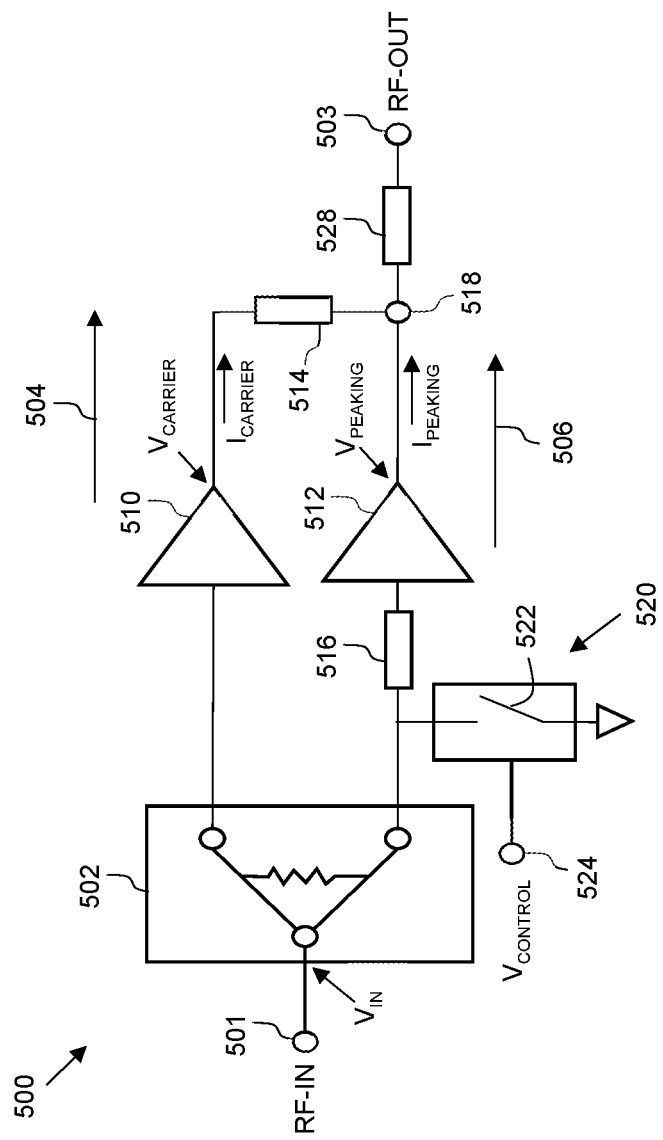
FIG. 5 is a simplified block diagram of a Doherty power amplifier with an externally controllable sub-circuit, in accordance with an example embodiment.

As mentioned above, the power amplifier 265 may include one or more externally controllable sub-circuits, the operation of which is controlled using the control bit(s) received in the I or Q serialized data streams. For example, FIG. 5 is a simplified block diagram of a Doherty power amplifier 500 with an externally controllable sub-circuit 520 that may be operated based on the values of the control bit(s) received in the I and/or Q serialized data streams, in accordance with an example embodiment.

More specifically, Doherty amplifier 500 (e.g., amplifier 265, FIGS. 2, 3) includes an input terminal 501, a power splitter 502, a carrier amplifier path 504, a peaking amplifier path 506, a summing node 518, an externally controllable sub-circuit 520, and an output terminal 503. The power splitter 502 is coupled both to the carrier amplifier path 504 and to the peaking amplifier path 506, and is configured to divide an input signal (RF-IN, which is characterized by an instantaneous voltage of $V_{in}$) (e.g., signal 376, FIG. 3) received at input terminal 501 into a carrier RF signal and a peaking RF signal. More specifically, the outputs of power splitter 502 are connected to carrier amplifier 510 (also referred to as a main amplifier) and to peaking amplifier 512. Impedance matching networks or circuits (not illustrated) may be included along the signal transmission paths between the outputs of power splitter 502 and the inputs to the carrier and peaking amplifiers 510, 512. To ensure proper Doherty operation, the carrier amplifier 510 along the carrier amplifier path 504 is biased to operate in Class-AB, and the peaking amplifier 512 along the peaking amplifier path 506 is biased to operate in Class-C.

In the illustrated embodiment, Doherty amplifier 500 has a "non-inverted" Doherty configuration, in which an impedance inverter and/or a λ/4 (90 degree) phase shift element 514 is connected between the output of carrier amplifier 510 and the summing node 518. The output of peaking amplifier 512 also is connected to the summing node 518. The phase shift introduced by element 514 is, in some implementations, compensated by a 90 degree relative phase shift present on path 506 introduced by phase shift element 516, which is present between the power splitter 502 and the input to the peaking amplifier 512. In an alternate embodiment, amplifier 500 may have an "inverted" Doherty configuration. In such a configuration, the impedance inverter and/or λ/4 line phase shift element 514 instead is connected between the output of peaking amplifier 512 and the summing node 518, rather than being connected between the output of carrier amplifier 510 and the summing node 518. In addition, in an inverted Doherty implementation, the phase shift introduced by element 514 between the output of the peaking amplifier 512 and the summing node 518 can be compensated by a 90 degree relative phase shift present on path 504 (e.g., between power splitter 502 and the input to the carrier amplifier 510), rather than on path 506. An impedance transformation network 528 between summing node 518 and the amplifier output 503 functions to present the proper load impedances to each of carrier amplifier 510 and peaking amplifier 512, and outputs the combined signal produced at summing node 518 to the output terminal 503 as an output signal (RF-OUT). The output signal, RF-OUT, in turn, may be provided to an antenna (e.g., antenna 253, FIGS. 2, 3), for radiation over the air interface.

Figure 6A:
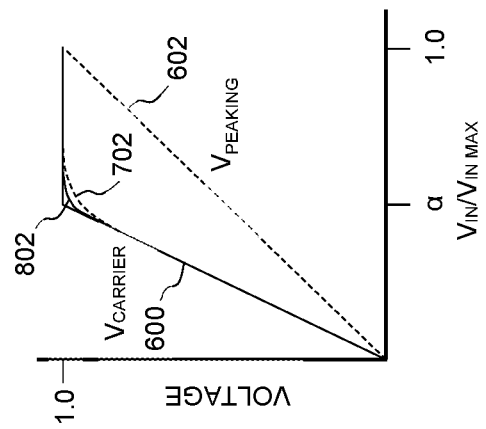
FIGS. 6A and 6B are graphs depicting the operational performance of an idealized Doherty amplifier, a conventional Doherty amplifier, and an embodiment of a Doherty amplifier with an externally controllable sub-circuit.
Figure 6B:
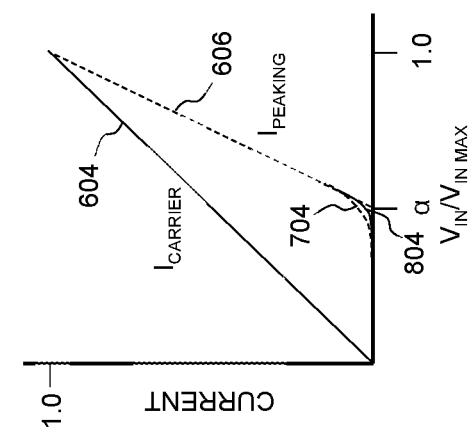

The operation of a Doherty amplifier is based on well-known first order concepts where the carrier amplifier 510 and peaking amplifier 512 are modeled as current sources when not saturated, and voltage sources when saturated. The Doherty amplifier operational concept is illustrated in FIGS. 6A and 6B, which are graphs depicting the operation of an idealized Doherty amplifier, a conventional Doherty amplifier, and the Doherty amplifier depicted in FIG. 5. Each graph shows data for the carrier amplifier and peaking amplifier of the Doherty amplifier. In FIG. 6A, line 600 shows the voltage for the carrier amplifier, and line 602 shows voltage for the peaking amplifier of an idealized Doherty amplifier. In FIG. 6B, line 604 shows the current for the carrier amplifier, and line 606 shows the current for the peaking amplifier of an idealized Doherty amplifier. In both graphs, the voltage and current values have been normalized around the value of 1.0.

At low input power levels, the peaking amplifier is non-conducting due to the Class-C bias of peaking amplifier. As such, all amplification generated by the amplifier is achieved using only the carrier amplifier. With increasing input power levels (e.g., increasing levels of $V_{in}$), a point is reached (i.e., transition point α as labeled on both FIGS. 6A and 6B) where the radio frequency (RF) input signal is sufficiently large such that the carrier amplifier is at the onset of saturation and produces a consistent RF output voltage of 1 V (normalized) (see the horizontal portion of line 600 of FIG. 6A). When saturated, the carrier amplifier can be represented and modeled by first order principles as a voltage source such that with further increases in input power, $V_{carrier}$ remains at unity (normalized). Due to impedance inverters 514 and 528 (shown in FIG. 5), voltage $V_{peaking}$ is less than unity. With further increases in input power, the operation of the carrier amplifier and the peaking amplifier moves beyond the point α. The carrier amplifier begins to conduct and contribute current, $I_{peaking}$, which has the effect of modulating the impedance seen by the carrier amplifier. This further allows the carrier amplifier to contribute additional RF current. Under full drive conditions where $V_{in}/V_{in\_max}$ equals unity, both the carrier amplifier and the peaking amplifier are saturated and producing maximum power.

In reality, the peaking amplifier is not an ideal voltage and current source. $I_{peaking}$ does not transition abruptly from zero to above zero as $V_{in}/V_{in\_max}$ transitions from below α to above α due to the Class-C operation of the peaking amplifier. In other words, the sharp corners in lines 600, 602, 604, and 606 at transition point α of FIGS. 6A and 6B do not accurately depict the operation of a real Doherty amplifier. In practice, the responses are more gradual for both $I_{peaking}$ and $V_{carrier}$.

Dashed lines 702 and 704 represent the actual voltage and current curves of a conventional Doherty amplifier about transition point α. As seen in FIG. 6A, about transition point α the voltage of the carrier amplifier (depicted by line 602) does not sharply transition from increasing to reaching a maximum value of 1.0 V. Instead, as shown by dashed line 702, the transition is gradual. As such, in a real amplifier, even at some power output level greater than that of transition point α, the carrier amplifier has still not reached full saturation, again, in contradiction to the idealized model. Similarly, as seen in FIG. 6B, the current of the peaking amplifier (depicted by line 606) does not sharply transition when the peaking amplifier begins conducting near transition point α. Instead, as shown by dashed line 704, the transition is gradual. As such, in a real amplifier, even at some power output less than that of transition point α, the peaking amplifier is already conducting, in contradiction to the idealized model. These effects may be deleterious on the overall Doherty efficiency about transition operating point α.

By incorporating switch 522 into the Doherty amplifier 500 and controlling the variable resistance of switch 522 according to the methods described below, the performance of Doherty amplifier 500 can be made to more closely approximate that of an ideal amplifier in comparison to conventional devices.

In the embodiment of FIG. 5, externally controllable sub-circuit 520 includes a resistive switch 522, which is connected to peaking path 506 in a shunt configuration. In various implementations, the resistive switch 522 may include one or more transistors, for example, P-high-electron-mobility transistors (pHEMTs) that may be manufactured using gallium arsenide (GaAs), FETs (Field Effect Transistors) using silicon-on-insulator technologies, or other types of transistors. In one implementation, the resistive switch 522 is a circuit element having two terminals having an adjustable resistance between the two terminals. An analog control input 524 receives an analog control signal (e.g., from one of control circuits 266, 267, FIGS. 2, 3), which is configured to control the resistance between the two terminals.

In the illustrated embodiment, a first current carrying terminal of switch 522 is connected to peaking path 506 between an output of power splitter 502 and an input of peaking amplifier 512. A second current carrying terminal of switch 522 is connected to a voltage reference (e.g., Vdd or ground), for example through a ground voltage node. Switch 522 includes a control input 524 for receiving an analog control signal, $V_{control}$. According to an embodiment, analog control input 524 may be coupled to a control circuit (e.g., control circuit 266 or 267, FIGS. 2, 3), which produces the analog control signal (e.g., signal 380 or 381, FIGS. 2, 3), and the voltage of the control signal sets switch 522 to a desired resistance level between the current carrying terminals. In this manner, operation of the externally controllable sub-circuit 520 may be modified based on the analog control signal provided by the control circuit (e.g., control circuit 266 or 267, FIGS. 2, 3).

In one implementation, switch 522 may be binary, and thus controlled to be in a first or second state based on the voltage, $V_{control}$, of the control signal present at the control input 524. For example, a first input value or voltage at input 524 may configure switch 522 in a low resistance or conductive state (i.e., a "closed" state with relatively low resistance between the current carrying terminals), and a second input value or voltage at input 524 may configure switch 522 in a high resistance or non-conductive state (i.e., an "open" state with a relatively high resistance between the current carrying terminals). Alternatively, the input, $V_{control}$, at input 524 of switch 522 may be analog. In that case, the resistance of switch 522 may be set in response to $V_{control}$ being set to a particular analog voltage value. The analog voltage value may then be mapped by switch 522 to a particular resistance value. In still other implementations, switch 522 may be configurable to a plurality of different resistances, where the $V_{control}$ at input 524 of switch 522 may be one of a plurality of values to select a particular one of those different resistances.

In the embodiment of Doherty amplifier 500 depicted in FIG. 5, the RF voltage at the input of the peaking amplifier 512 is modulated using the variable resistance or resistive switch element 522. This modulation controls the operation of the peaking amplifier and may improve overall efficiency of the Doherty amplifier 500. Referring again to FIGS. 6A and 6B, curves 802 and 804 represent the voltage and current curves about transition point α of a Doherty amplifier configured in accordance with FIG. 5. As seen in FIG. 6A, in the amplifier 500 incorporating switch 522, the carrier amplifier 510 reaches saturation voltage at a reduced output beyond transition point α as compared to a conventional device (see line 702). Similarly, with regards to FIG. 6B, in the amplifier 500 incorporating switch 522, the peaking amplifier 512 begins conducting at a greater input power level as compared to a conventional device (see line 704). These two attributes of the Doherty amplifier 500 may realize a more ideal and more efficient Doherty power amplifier by enhancing the effective turn-on characteristics of the peaking amplifier 512. More specifically, as is illustrated in FIGS. 6A and 6B, by incorporating switch 522 into the Doherty amplifier 500 and controlling the variable resistance of switch 522 according to the methods described herein, the performance of Doherty amplifier 500 can be made to more closely approximate that of an ideal amplifier in comparison to conventional devices.

In one implementation, for input signal levels of RF-IN less than the signal levels corresponding to threshold value α, the control signal, $V_{control}$, provided at input 524 of switch 522 causes switch 522 to be set to a low resistance in order to shunt RF signal energy present on the peaking amplifier path 506 to ground, and thus to prevent the Class-C biased peaking amplifier 512 turning on and conducting current. Specifically, the RF voltage present at the input to the peaking amplifier 512 is reduced when switch 522 is set to a low resistance, thereby keeping the peaking amplifier in a non-conducting state. The equivalent resistance of the resistive switch 522 in this state need not be close to zero ohms, and in fact, a value greater than zero ohms may be utilized so as to limit RF voltage standing wave ratio (VSWR) mismatch effects due to the switching action. Hence, the resistive switch 522 is operated as a resistive element, switching between two resistance values or states where the lower resistance value may be in the 10's of ohms (e.g., between about 5 ohms and about 50 ohms or more), and the high resistance value may be several orders of magnitude larger (e.g., between about 1000 ohms to about 5000 ohms or more). This allows carrier amplifier 510 to approach its saturation voltage without interference from peaking amplifier 512, resulting in higher Doherty efficiency at transition point α. Conversely, as the input signal levels grow greater than α, at which point carrier amplifier 510 is saturated, the control signal, $V_{control}$, provided at input 524 of switch 522 causes switch 522 to be set to a relatively high resistance, allowing peaking amplifier 512 to begin operating.

Generally, when transitioning from a low resistance to a high resistance, the control signal, $V_{control}$, provided at input 524 may cause switch 522 to make the transition over a relatively small transition voltage range. For example, the voltage transition range may be between about 1% and about 10% of $V_{in\_max}$. As the resistance of switch 522 increases, peaking amplifier 512 observes an increasing magnitude of the input signal at the input of peaking amplifier 512 and begins conducting. The transition of resistance of switch 522 from low to high over a relatively small transition voltage may result in a smooth, but relatively abrupt turn-on of peaking amplifier 512, thereby preserving a smooth gain response of the overall Doherty amplifier 500. If, however, switch 522 were to change from low resistance to high resistance instantaneously or near-instantaneously, such a change in resistance could introduce transient signals into the signal path of the Doherty amplifier.

By keeping the resistance of switch 522 low at input levels below transition point α, the input signal to peaking amplifier 512 is kept small as much of the signal provided by the power splitter 502 to the peaking amplifier path 506 passes through switch 522 due to the low resistance of switch 522. Therefore, the input signal amplitude is kept small enough to prevent peaking amplifier 512 from conducting before carrier amplifier 510 has reached saturation. At full drive conditions and when the input levels exceed the transition point α, switch 522 is set to a relatively high resistance, and normal Doherty operation is achieved. In one implementation, the low resistance value of switch 522 is greater than about 10 ohms and may be between about 10 and about 20 ohms. In an alternate embodiment, the low resistance value of switch 522 may be in a range of about 20 ohms to about 100 ohms or more. The high resistance value of switch 522 may be greater than 1,000 ohms and, in some cases, as high a resistance value as the amplifier design allows (e.g., up to about 5,000 ohms or more).

In the present embodiment, it is desirable that the low resistance value of switch 522 not be equal to, or approximately equal to, about 0 ohms. If the low resistance of switch 522 were to approximate a short circuit, when changing state (either from low to high resistance or high to low resistance), the switch 522 may create an undesirable transient glitch into the amplifier's complex gain response and degrade amplifier linearity. That transient may be observed in the amplifier's gain, amplitude-modulation/phase-modulation, linearity, etc. Linearity performance and amplifier linearizability (using DPD for example) is important for cellular infrastructure transmitter applications. Accordingly, the in the present system, switch 522, when in its low resistance state, exhibits a resistance of at least 10 ohms for a 50 ohm system.

Figure 6C:
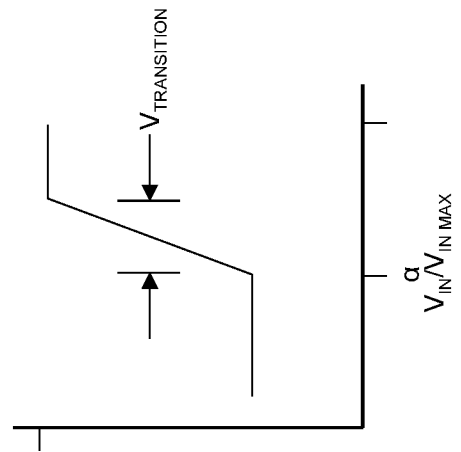
FIG. 6C is a graph depicting a resistance of switch versus voltage, in accordance with an example embodiment.

In some embodiments, switch 522 exhibits a resistance that is a function of $V_{in}/V_{in\_max}$. FIG. 6C is a graph depicting a resistance of switch 522 versus $V_{in}/V_{in\_max}$. As shown in FIG. 6C, the response of switch 522 is piece-wise-linear, although other functions can be used as well. At levels of $V_{in}/V_{in\_max}$ below transition point α, the resistance of switch 522 is set to a relatively low value. As the value of $V_{in}/V_{in\_max}$ transitions above transition point α, the resistance of switch 522 increases linearly over a transition range that is denoted $V_{transition}$. At the end of the transition range, switch 522 is set to a relatively high (e.g., maximum) resistance. In various other implementations, the resistance of switch 522, rather than being determined by the value of $V_{in}/V_{in\_max}$ may instead be a function of the amplitude of an envelope of an input signal to the Doherty amplifier. For example, when the envelope amplitude is relatively low, switch 522 may be set to a first resistance state (e.g., a low resistance state), and when the envelope amplitude is relatively high, switch 522 may be set to a second resistance state (e.g., a high resistance state).

An alternative implementation of Doherty amplifier 500 calls for switch 522 to be connected in series between power splitter 502 and peaking amplifier 512, rather than in the shunt configuration depicted in FIG. 5. More specifically, a first current carrying terminal of switch 522 is connected to the peaking path output of power splitter 502, and a second current carrying terminal of switch 522 is connected to the input to the peaking amplifier 512. When connected in series, switch 522 would exhibit the opposite resistance characteristics than those described above where switch 522 is in a shunt configuration. Accordingly, when switch 522 is coupled in series, for levels of $V_{in}/V_{in\_max}$ below transition point α, the resistance of the switch would be set to a high value, and the resistance would be controlled to decrease linearly over a transition range. At the end of the transition range, the resistance of the switch 522 would be set to a low (e.g., minimum) resistance value. In the series configuration, though, in contrast to the shunt configuration described above, the low resistance state may be at or near zero ohms (e.g., between about 0 ohms and about 5 ohms), while the high resistance state should be limited to a maximum higher value (e.g., between about 100 ohms and about 300 ohms or more), such as approximately 200 ohms to prevent VSWR mismatch effects leading to discontinuities in amplifier gain and or phase, for example.

As indicated above, Doherty amplifier 500 with externally controllable sub-circuit 520 could be utilized as amplifier 265 of FIGS. 2 and 3. Accordingly, the control signal 380 or 381 may correspond to the control signals provided to control input 524. In other embodiments, Doherty amplifiers with additional or different externally controllable sub-circuits could be utilized for amplifier 265. For example, another embodiment of a Doherty amplifier may include variable phase and/or variable amplitude circuits along the carrier and/or peaking paths 504, 506, and control signals 380, 381 may provide signals to the Doherty amplifier that affect the operation of the variable phase and/or variable amplitude circuits.

Figure 7:
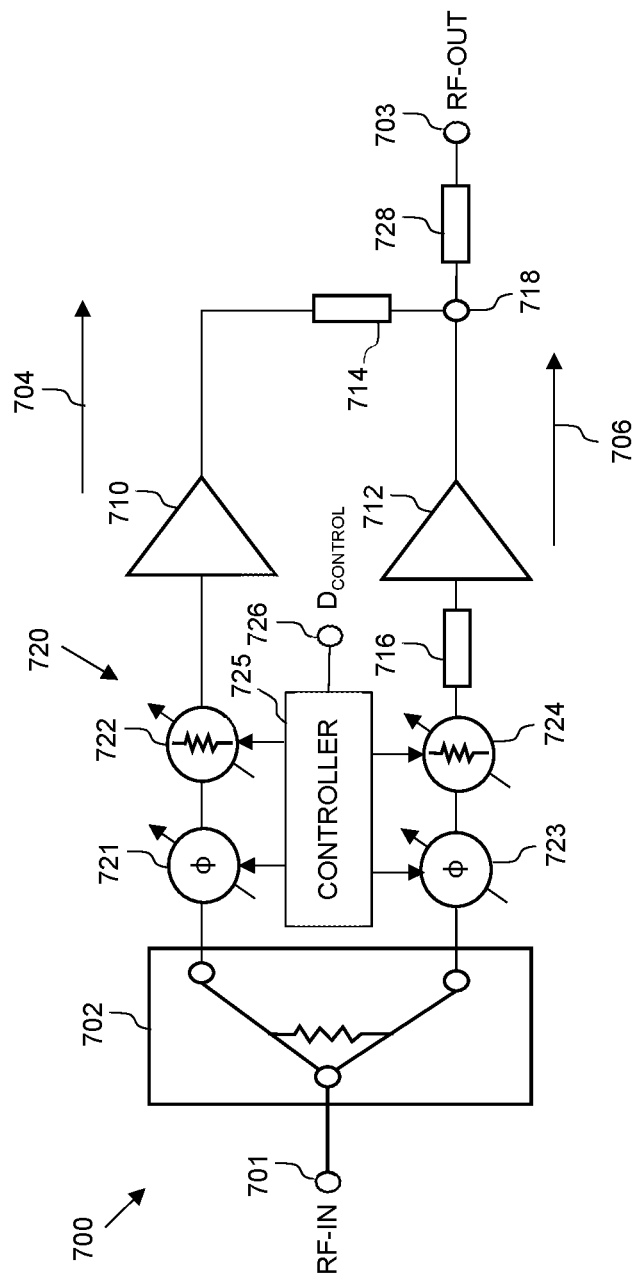
FIG. 7 is a simplified block diagram of a Doherty power amplifier with a digitally controllable sub-circuit, in accordance with another example embodiment.

For example, FIG. 7 is a simplified block diagram of another embodiment of a Doherty power amplifier 700 with an externally controllable sub-circuit 720 that may be operated based on the values of the control bit(s) received in the I and/or Q serialized data streams, in accordance with an example embodiment.

More specifically, Doherty amplifier 700 (e.g., amplifier 265, FIGS. 2, 3) includes an input terminal 701, a power splitter 702, a carrier amplifier path 704, a peaking amplifier path 706, a summing node 718, an externally controllable sub-circuit 720, and an output terminal 703. The power splitter 702 is coupled both to the carrier amplifier path 704 and to the peaking amplifier path 706, and is configured to divide an input signal (RF-IN) (e.g., signal 376, FIG. 3) received at input terminal 701 into a carrier RF signal and a peaking RF signal. The outputs of power splitter 702 are connected to carrier amplifier 710 and to peaking amplifier 712, and impedance matching networks or circuits (not illustrated) may be included along the signal transmission paths between the outputs of power splitter 702 and the inputs to the carrier and peaking amplifiers 710, 712. To ensure proper Doherty operation, the carrier amplifier 710 is biased to operate in Class-AB, and the peaking amplifier 712 is biased to operate in Class-C.

In the illustrated embodiment, Doherty amplifier 700 has a "non-inverted" Doherty configuration, as described above, and in which an impedance inverter and/or a λ/4 (90 degree) phase shift element 714 is connected between the output of carrier amplifier 710 and the summing node 718. The output of peaking amplifier 712 also is connected to the summing node 718. The phase shift introduced by element 714 is, in some implementations, compensated by a 90 degree relative phase shift present on path 706 introduced by phase shift element 716, which is present between the power splitter 702 and the input to the peaking amplifier 712. In an alternate embodiment, amplifier 700 may have an "inverted" Doherty configuration, as described above in conjunction with FIG. 5. An impedance transformation network 728 between summing node 718 and the amplifier output 703 functions to present the proper load impedances to each of carrier amplifier 710 and peaking amplifier 712, and outputs the combined signal produced at summing node 718 to the output terminal 703 as an output signal (RF-OUT). The output signal, RF-OUT, in turn, may be provided to an antenna (e.g., antenna 253, FIGS. 2, 3), for radiation over the air interface.

Doherty amplifier 700 also includes an externally controllable sub-circuit 720. Sub-circuit 720 specifically includes any one or more of a first variable phase shifter 721 and/or a first variable attenuator 722 disposed along the carrier amplification path 704 between the power splitter 702 and the input to the carrier amplifier 710, and a second variable phase shifter 723 and/or a second variable attenuator 724 disposed along the peaking amplification path 706 between the power splitter 702 and the input to the peaking amplifier 712. Each of the variable phase shifters 721, 723 may be controlled, by controller 725, to apply one of a plurality of phase shifts to the carrier RF signal or the peaking RF signal, respectively. Similarly, each of the variable attenuators 722, 724 may be controlled, by controller 725, to attenuate the carrier RF signal or the peaking RF signal, respectively, by one of a plurality of attenuation levels.

Controller 725 includes a control input 726 for receiving a digital control signal, $D_{control}$, which may be a single-bit or multi-bit value. The value of $D_{control}$ may specifically indicate one of a plurality of phase shift and/or attenuation settings (or a combination of settings) for the variable phase shifters 721, 723 and/or the variable attenuators 722, 724. According to an embodiment, digital control input 726 may be coupled to a control circuit (e.g., control circuit 266 or 267, FIGS. 2, 3), which produces the control signal (e.g., signal 380 or 381, FIGS. 2, 3), and the controller 725 determines a phase shift and/or attenuation level to be applied by one or more of the variable phase shifters 721, 723 or the variable attenuators 722, 724 based on the digital value of the control signal. In this manner, operation of the externally controllable sub-circuit 720 may be modified based on the digital control signal provided by the control circuit (e.g., control circuit 266 or 267, FIGS. 2, 3). Although two example amplifiers with controllable sub-circuits are illustrated and described in conjunction with FIGS. 5-7, in still other embodiments, other types of amplifiers that include other types of externally controllable sub-circuits also could be used for amplifier 265 (FIGS. 2, 3).

Figure 8:
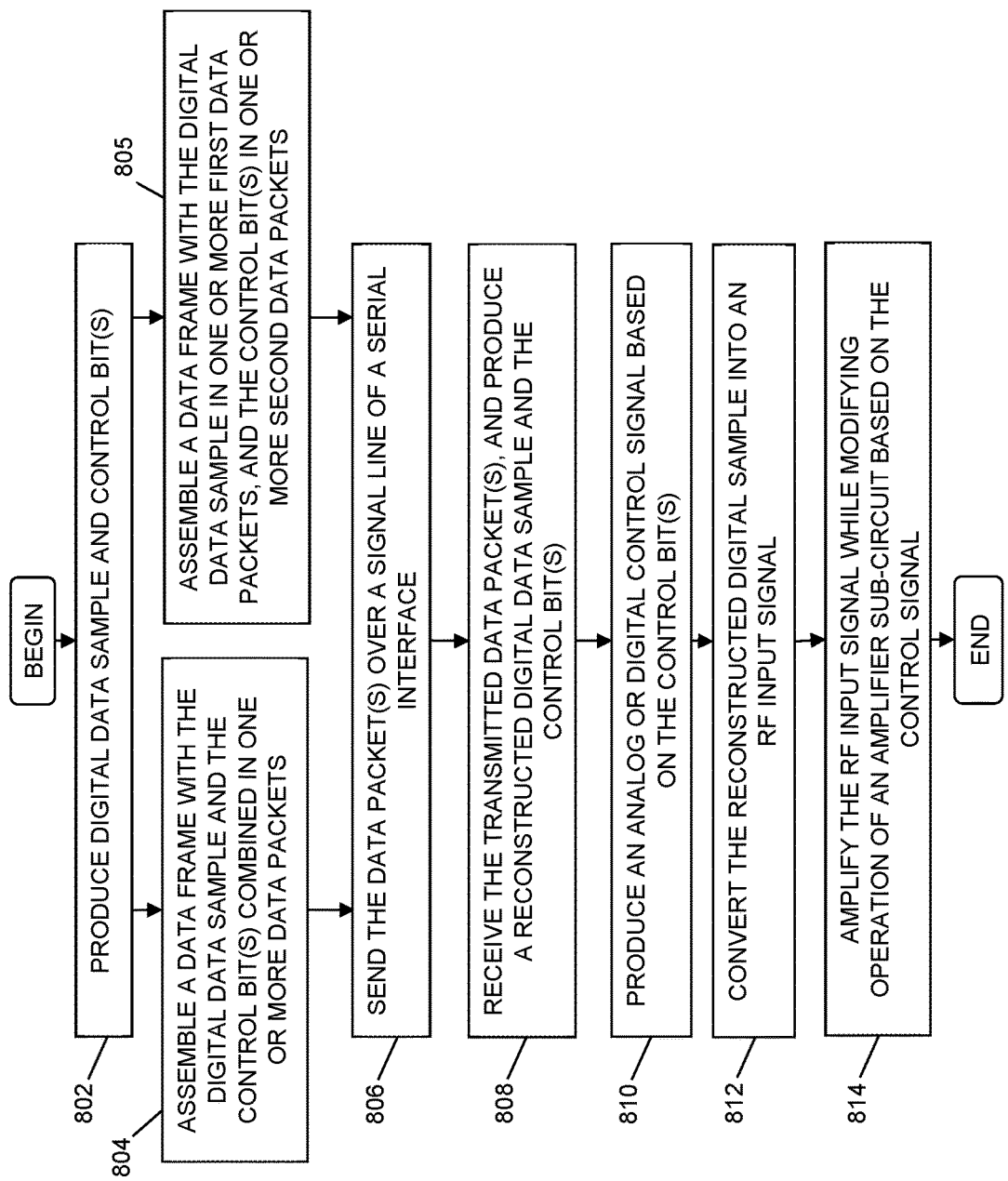
FIG. 8 is a flowchart of a method for communicating data and control signals over a serial link between a processor, a digital-to-analog converter, and an amplifier of an RF transmitter lineup, in accordance with an example embodiment.

FIG. 8 is a flowchart of a method for communicating data and control signals over a serial link between a digital data processor (e.g., DFE 201, FIGS. 2, 3), a digital-to-analog converter (e.g., DAC 262, 263, FIGS. 2, 3), and an amplifier (e.g., amplifier 265, 500, 700, FIGS. 2, 3, 5, 7) of an RF transmitter lineup, in accordance with an example embodiment. In block 802, a digital data processor (e.g., transmit processor 220, FIG. 2) produces a plurality of digital data samples (e.g., I and/or Q samples) and one or more control bits. In block 804, and according to the embodiments of FIGS. 4A and 4B, the digital data sample and the one or more control bits are combined by one or more serialized transmit interfaces (e.g., interface 221-I and/or 221-Q, FIGS. 2, 3) into one or more data packets. Alternatively, in block 805, and according to the embodiment of FIG. 4C, the digital data processor (e.g., transmit processor 220, FIG. 2) produces a plurality of digital data samples (e.g., I and/or Q samples) and one or more control data packets that include one or more control bits. In block 806, the serialized transmit interface frames, optionally encodes, serializes, and sends the one or more data packets over a signal line (e.g., one of signal lines 271, FIGS. 2, 3) or a signal lane (e.g., including both of signal lines 271) as one or more transmitted data packets.

On the receive side, one or more serialized receive interfaces (e.g., interface 260-I and/or 260-Q, FIGS. 2, 3) receive the transmitted data from the signal line (or signal lane), in block 808. The serialized receive interface(s) then de-serializes, optionally decodes, and de-frames the data to produce a plurality of digital data packets and, ultimately, one or more reconstructed digital data samples from the one or more transmitted data packets. Further, and according to an embodiment, the serialized receive interface(s) also produce the one or more control bits from the one or more transmitted data packets. In block 810, one or more control circuits (e.g., control circuits 266, 267, FIGS. 2, 3) produce one or more analog and/or digital control signals from the one or more control bits produced by the serialized receive interface.

In block 812, a converter circuit (e.g., including DACs 262, 263, LPFs 370, 371, mixers 373, 374, and combiner 264, FIGS. 2, 3) produces an RF input signal (e.g., signal 376, FIG. 3) by performing a digital-to-analog conversion of the reconstructed digital data samples to produce analog I and Q data sample signals, upconverting the analog I and Q signals to RF, and phase aligning and combining the signals. Finally, in block 814, a power amplifier (e.g., PA 265, 500, 700, FIGS. 2, 3, 5, 7) amplifies the RF input signal. As described previously, the power amplifier includes a sub-circuit (e.g., sub-circuit 520, 720, FIGS. 5, 7) that is controllable based on the control signal produced by the control circuit. According to an embodiment, the power amplifier modifies operation of the sub-circuit based on the control signal.

Although embodiments of the inventive subject matter described above and illustrated in the drawings include receiver circuitry with a digital-to-analog converter that converts received digital data samples to an analog signal, which is coupled to a power amplifier with a sub-circuit that is controllable based on received control bits, the inventive subject matter may be applied in other types of systems, as well. More generally, the inventive subject matter includes encapsulating (e.g., combining in one or more data packets) control bits with digital data samples, so that, when the combined control bits and digital data samples are conveyed through a communications link (e.g., a signal line or lane) with a variable delay, the control bits and digital data samples remain synchronous (i.e., time-aligned with each other) all the way to the receiver circuitry. As discussed in detail above, in some embodiments, the control bits are inserted in the data packets into bits that otherwise are unused (i.e., not filled with data bits). In other embodiments, the control bits are combined into one or more dedicated control data packets. On the receive side of the system, utilization and/or processing of the control bits and the digital data samples is application specific. Accordingly, although some embodiments include applications associated with a receiver that includes a digital-to-analog converter that produces an analog signal from the received digital data samples, and the resulting analog signal is upconverted to an RF signal that is amplified by a power amplifier (e.g., where an aspect of the amplification is affected by the received control bits), other embodiments may include receiver circuitry other than a digital-to-analog converter (i.e., a digital device other than a digital-to-analog converter), and/or applications other than RF amplification. In other words, how the control bits and digital data samples are utilized and processed on the receive side of the system is application specific, and is not limited to receiver circuitry that includes a digital-to-analog converter or an RF power amplifier. Further still, although some embodiments discussed above and illustrated in the drawings are associated with communication systems that transmit/receive RF signals over an air interface utilizing antennas, in other embodiments, the communication medium may include physical transmission media such as electrical cables, optical fiber, and so on, instead of an air interface.

An embodiment of a communication system includes a digital data processor configured to produce a digital data sample and one or more control bits, and a serialized transmit interface coupled to the digital data processor and to a first end of a signal line. The serialized transmit interface is configured to assemble a data frame that includes the digital data sample in one or more first data packets and the one or more control bits in one or more second data packets, and send the data frame over the signal line. The system further includes a serialized receive interface coupled a second end of the signal line. The serialized receive interface is configured to receive the data frame from the signal line, produce a reconstructed digital data sample from the one or more first data packets, and produce the one or more control bits from the one or more second data packets. The system further includes a control circuit coupled to the serialized receive interface, and configured to produce a control signal from the one or more control bits provided by the serialized receive interface.

According to a further embodiment, the system may further include a converter circuit configured to produce a radio frequency (RF) input signal by performing a digital-to-analog conversion of the reconstructed digital data sample to produce an analog data sample signal, and upconverting the analog data sample signal to RF. The system may further include a power amplifier that includes a sub-circuit that is controllable based on the control signal produced by the control circuit, where the power amplifier is configured to amplify the RF input signal, and to modify operation of the sub-circuit based on the control signal. According to a further embodiment of the system, the serialized transmit interface and the serialized receive interface implement a JESD204 serial link communications protocol.

According to another further embodiment of the system, the serialized transmit interface is configured to send the one or more data packets over the signal line as one or more transmitted data packets by encoding the one or more data packets to produce one or more encoded symbols, and sending the one or more data packets over the serial link within the one or more encoded symbols. According to a further embodiment, the serialized receive interface is configured to receive the one or more transmitted data packets from the signal line by decoding the one or more encoded symbols.

According to yet another further embodiment of the system, the control circuit comprises a buffer with a programmable delay that is configured to synchronize, in the power amplifier, amplification of the RF signal with modification of the operation of the sub-circuit based on the control signal. According to yet another further embodiment of the system, the control circuit is configured to produce the control signal from the one or more control bits in the form of an analog control signal. According to a further embodiment, the sub-circuit of the power amplifier includes a switch, and the power amplifier is configured to modify operation of the sub-circuit by altering a state of the switch based on the analog control signal. According to another further embodiment, the power amplifier is a Doherty power amplifier with a carrier amplifier path and a peaking amplifier path, and the switch is connected to the peaking amplifier path in a shunt configuration. According to another further embodiment, the control circuit is configured to produce the control signal from the one or more control bits in the form of a digital control signal. According to a further embodiment, the sub-circuit of the power amplifier includes a digitally controlled circuit, and the power amplifier is configured to modify operation of the sub-circuit by altering operation of the digitally controlled circuit based on the digital control signal.

According to another further embodiment the power amplifier is a Doherty power amplifier with a carrier amplifier path and a peaking amplifier path, the Doherty power amplifier includes a power splitter configured to divide the RF input signal into a carrier RF signal and a peaking RF signal, the digitally controlled circuit includes one or more variable phase shifters coupled to either or both of the carrier amplifier path and the peaking amplifier path, and the power amplifier is configured to modify operation of the digitally controlled circuit by changing one or more phase shifts applied by the one or more variable phase shifters to either or both of the carrier RF signal and the peaking RF signal. According to a further embodiment, the converter circuit includes a digital-to-analog converter configured to performing the digital-to-analog conversion to produce the analog signal, and an upconverter configured to upconvert the analog signal to RF.

An embodiment of a method performed by a communication system includes producing, by a digital data processor, a digital data sample and one or more control bits. The method further includes a serialized transmit interface assembling the digital data sample into one or more first data packets of a data frame, assembling the one or more control bits into one or more second data packets of the data frame, and sending the data frame over a signal line. The method further includes a serialized receive interface receiving the data frame, producing a reconstructed digital data sample from the first data packet(s), and producing the one or more control bits from the second data packet(s). The method further includes producing, by a control circuit, a control signal from the one or more control bits produced by the serialized receive interface.

According to a further embodiment, the method may further include producing, by a converter circuit, a radio frequency (RF) input signal by performing a digital-to-analog conversion of the reconstructed digital data sample to produce an analog data sample signal, and upconverting the analog data sample signal to RF. The method may further include amplifying the RF input signal, by a power amplifier that includes a sub-circuit that is controllable based on the control signal produced by the control circuit. The method may further include modifying operation of the sub-circuit, by the power amplifier, based on the control signal.

According to a further embodiment of the method, the serialized transmit interface and the serialized receive interface implement a JESD204 serial link communications protocol. According to another further embodiment of the method, sending, by the serialized transmit interface, the one or more data packets over the signal line as one or more transmitted data packets includes encoding the one or more data packets to produce one or more encoded symbols, and sending the one or more data packets over the serial link within the one or more encoded symbols, and receiving, by the serialized receive interface, the one or more transmitted data packets from the signal line includes decoding the one or more encoded symbols. According to yet another further embodiment of the method, producing the control signal by the control circuit includes delaying production of the control signal by a programmable delay that is configured to synchronize, in the power amplifier, amplifying the RF signal with modifying the operation of the sub-circuit based on the control signal. According to yet another further embodiment of the method, producing the control signal comprises producing an analog control signal, the sub-circuit of the power amplifier includes a switch, and modifying operation of the sub-circuit comprises altering a state of the switch based on the analog control signal. According to yet another further embodiment of the method, producing the control signal comprises producing a digital control signal, the sub-circuit of the power amplifier includes a digitally controlled circuit, and modifying operation of the sub-circuit comprises altering operation of the digitally controlled circuit based on the digital control signal. According to yet another further embodiment of the method, the power amplifier is a Doherty power amplifier, and modifying operation of the sub-circuit based on the control signal comprises modifying operation of the Doherty power amplifier.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A communication system comprising:
   a digital data processor configured to produce a digital data sample and one or more control bits;
   a serialized transmit interface coupled to the digital data processor and to a first end of a signal line, wherein the serialized transmit interface is configured to
      assemble a data frame that includes the digital data sample in one or more first data packets and the one or more control bits in one or more second data packets, wherein the one or more control bits are configured to alter the state of a switch; and
      send the data frame over the signal line;
   a serialized receive interface coupled a second end of the signal line, wherein the serialized receive interface is configured to
      receive the data frame from the signal line,
      produce a reconstructed digital data sample from the one or more first data packets of the data frame, and
      produce the one or more control bits from the one or more second data packets of the data frame; and
   a control circuit coupled to the serialized receive interface, and configured to produce a control signal from the one or more control bits provided by the serialized receive interface, wherein the control circuit is configured to produce the control signal from the one or more control bits, wherein the control signal is configured to alter the state of the switch;
   a converter circuit configured to produce a radio frequency (RF) input signal by performing a digital-to-analog conversion of the reconstructed digital data sample to produce an analog data sample signal, and upconverting the analog data sample signal to RF; and
   a power amplifier that includes a sub-circuit that is controlled based on the control signal produced by the control circuit, wherein the power amplifier is configured to amplify the RF input signal, and to modify operation of the sub-circuit based on the control signal.

2. The communication system of claim 1, wherein the serialized transmit interface and the serialized receive interface implement a JESD204 serial link communications protocol.

3. The communication system of claim 1, wherein the serialized transmit interface is configured to send the data frame by:
   encoding the one or more first data packets and the one or more second data packets to produce encoded symbols; and
   sending the encoded symbols over the serial link.

4. The communication system of claim 3, wherein the serialized receive interface is configured to receive the data frame from the signal line by:
   decoding the encoded symbols.

5. The communication system of claim 1, wherein the control circuit comprises a buffer with a programmable delay that is configured to synchronize, in the power amplifier, amplification of the RF input signal with modification of the operation of the sub-circuit based on the control signal.

6. The communication system of claim 5, wherein the control circuit is configured to produce the control signal from the one or more control bits in the form of an analog control signal.

7. The communication system of claim 6, wherein the sub-circuit of the power amplifier includes the switch, and the power amplifier is configured to modify operation of the sub-circuit by altering a state of the switch based on the analog control signal.

8. The communications system of claim 7, wherein the power amplifier is a Doherty power amplifier with a carrier amplifier path and a peaking amplifier path, and wherein the switch is connected to the peaking amplifier path in a shunt configuration.

9. The communication system of claim 1, wherein the control circuit is configured to produce the control signal from the one or more control bits in the form of a digital control signal.

10. The communication system of claim 9, wherein the sub-circuit of the power amplifier includes a digitally controlled circuit, and the power amplifier is configured to modify operation of the sub-circuit by altering operation of the digitally controlled circuit based on the digital control signal.

11. The communications system of claim 10, wherein:
   the power amplifier is a Doherty power amplifier with a carrier amplifier path and a peaking amplifier path,
   the Doherty power amplifier includes a power splitter configured to divide the RF input signal into a carrier RF signal and a peaking RF signal,
   the digitally controlled circuit comprises one or more variable phase shifters coupled to either or both of the carrier amplifier path and the peaking amplifier path, and
   the power amplifier is configured to modify operation of the digitally controlled circuit by changing one or more phase shifts applied by the one or more variable phase shifters to either or both of the carrier RF signal and the peaking RF signal.

12. The communication system of claim 1, wherein the converter circuit comprises:
   a digital-to-analog converter configured to performing the digital-to-analog conversion to produce the analog signal; and
   an upconverter configured to upconvert the analog signal to RF.

13. A method performed by a communication system, the method comprising:
   producing, by a digital data processor, a digital data sample and one or more control bits, wherein the one or more control bits are configured to alter the state of a switch;
   assembling, by a serialized transmit interface, the digital data sample into one or more first data packets of a data frame;

assembling, by the serialized transmit interface, the one or more control bits into one or more second data packets of the data frame;

sending, by the serialized transmit interface, the data frame over a signal line;

receiving, by a serialized receive interface, the data frame from the signal line;

producing, by the serialized receive interface, a reconstructed digital data sample from the one or more first data packets;

producing, by the serialized receive interface, the one or more control bits from the one or more second data packets; and producing, by a control circuit, a control signal from the one or more control bits produced by the serialized receive interface, wherein the control circuit is configured to produce the control signal from the one or more control bits, wherein the control signal is configured to alter the state of the switch;

producing, by a converter circuit, a radio frequency (RF) input signal by performing a digital-to-analog conversion of the reconstructed digital data sample to produce an analog data sample signal, and upconverting the analog data sample signal to RF; and amplifying the RF input signal, by a power amplifier that includes a sub-circuit that is controlled based on the control signal produced by the control circuit; and modifying operation of the sub-circuit, by the power amplifier, based on the control signal.

14. The method of claim 13, wherein the serialized transmit interface and the serialized receive interface implement a JESD204 serial link communications protocol.

15. The method of claim 13, wherein:
sending, by the serialized transmit interface, the data frame includes encoding the one or more first data packets and the one or more second data packets to produce one or more encoded symbols, and sending the one or more encoded symbols over the serial link; and
receiving, by the serialized receive interface, the data frame from the signal line includes decoding the one or more encoded symbols.

16. The method of claim 13, wherein producing the control signal by the control circuit includes delaying production of the control signal by a programmable delay that is configured to synchronize, in the power amplifier, amplifying the RF signal with modifying the operation of the sub-circuit based on the control signal.

17. The method of claim 13, wherein:
producing the control signal comprises producing an analog control signal;
the sub-circuit of the power amplifier includes the switch; and
modifying operation of the sub-circuit comprises altering a state of the switch based on the analog control signal.

18. The method of claim 13, wherein:
producing the control signal comprises producing a digital control signal;
the sub-circuit of the power amplifier includes a digitally controlled circuit; and
modifying operation of the sub-circuit comprises altering operation of the digitally controlled circuit based on the digital control signal.

19. The method of claim 13, wherein the power amplifier is a Doherty power amplifier, and wherein modifying operation of the sub-circuit based on the control signal comprises modifying operation of the Doherty power amplifier.

* * * * *